(12) United States Patent
Son et al.

(10) Patent No.: US 11,890,604 B2
(45) Date of Patent: Feb. 6, 2024

(54) COMPOSITE CATALYST FOR CARBON DIOXIDE REDUCTION AND METHOD OF FABRICATING OF THE SAME

(71) Applicant: KOREA UNIVERSITY RESEARCH AND BUSINESS FOUNDATION, SEJONG CAMPUS, Sejong-si (KR)

(72) Inventors: Ho Jin Son, Suwon-si (KR); Sang Ook Kang, Sejong-si (KR); Sung Han Choi, Busan (KR); Chul Hoon Kim, Sejong-si (KR)

(73) Assignee: KOREA UNIVERSITY RESEARCH AND BUSINESS FOUNDATION, SEJONG CAMPUS, Sejong-si (KR)

( * ) Notice: Subject to any disclaimer, the term of this patent is extended or adjusted under 35 U.S.C. 154(b) by 253 days.

(21) Appl. No.: 17/185,593

(22) Filed: Feb. 25, 2021

(65) Prior Publication Data
US 2021/0220809 A1    Jul. 22, 2021

Related U.S. Application Data

(63) Continuation of application No. PCT/KR2019/011194, filed on Aug. 30, 2019.

(30) Foreign Application Priority Data

Aug. 30, 2018 (KR) ........................ 10-2018-0102411

(51) Int. Cl.
| | | |
|---|---|---|
| *B01J 35/00* | (2006.01) | |
| *C01B 32/40* | (2017.01) | |
| *B01J 21/06* | (2006.01) | |
| *B01J 31/18* | (2006.01) | |
| *B01J 35/10* | (2006.01) | |
| *B01J 37/02* | (2006.01) | |
| *C23C 16/455* | (2006.01) | |

(52) U.S. Cl.
CPC ........ *B01J 35/0006* (2013.01); *B01J 21/066* (2013.01); *B01J 31/183* (2013.01); *B01J 31/1815* (2013.01); *B01J 35/004* (2013.01); *B01J 35/10* (2013.01); *B01J 37/0215* (2013.01); *C01B 32/40* (2017.08); *B01J 2531/004* (2013.01); *B01J 2531/26* (2013.01); *B01J 2531/74* (2013.01); *C23C 16/45553* (2013.01)

(58) Field of Classification Search
None
See application file for complete search history.

(56) References Cited

PUBLICATIONS

Waki et al., Chemistry: A European Journal, 2018, 24, 3846-3853 (Year: 2018).*

(Continued)

*Primary Examiner* — Yun Qian
(74) *Attorney, Agent, or Firm* — Studebaker & Brackett PC

(57) ABSTRACT

Provided is a carbon dioxide reduction composite catalyst, comprising an organic-inorganic porous body, and a molecular reduction catalyst combined with the organic-inorganic porous body, wherein the organic-inorganic porous body includes metal oxide clusters, and a light-condensing organic material as linkers between the metal oxide clusters, and the linkers absorb visible light to form excitons, and move the excitons through energy transfer between the linkers to transfer the electrons of the excitons to the molecular reduction catalyst.

7 Claims, 22 Drawing Sheets

(56) References Cited

PUBLICATIONS

Feng et al. Angew. Chem. Int. Ed. 51, 10307-10310). (Year: 2012).*

Cheng Wang et al., "Doping Metal-Organic Frameworks for Water Oxidation, Carbon Dioxide Reduction, and Organic Photocatalysis", Journal of the American Chemical Society, Jul. 22, 2011, vol. 133(34), pp. 13445-13454, DOI: 10.1021/ja203564w.

Ho-Jin Son et al., Light-Harvesting and Ultrafast Energy Migration in Porphyrin-Based Metal-Organic Frameworks, Journal of the American Chemical Society, Dec. 18, 2012, vol. 135(2), pp. 862-869, DOI: 10.1021/ja310596a.

Jiewei Liu et al.; "A porous rhodium(III)-porphyrin metal-organic framework as an efficient and selective photocatalyst for CO2 reduction"; Applied Catalysis B: Environmental; vol. 231; Sep. 5, 2018; pp. 173-181, Elsevier.

Yanming Zhao et al.; "Coordinative integration of a metal-porphyrinic framework and TiO2 nanoparticles for the formation of composite photocatalysts with enhanced visible-light-driven photocatalytic activities"; Journal of Materials Chemistry A; vol. 5; Jun. 28, 2017; pp. 15380-15389; Royal Society of Chemistry.

Ho-Jin Son; "Development of MOF Photocatalyst"; Research Project; Korean University Sejong Campus; May 28, 2017; total 54 pages; Republic of Korea.

* cited by examiner

[FIG. 1]
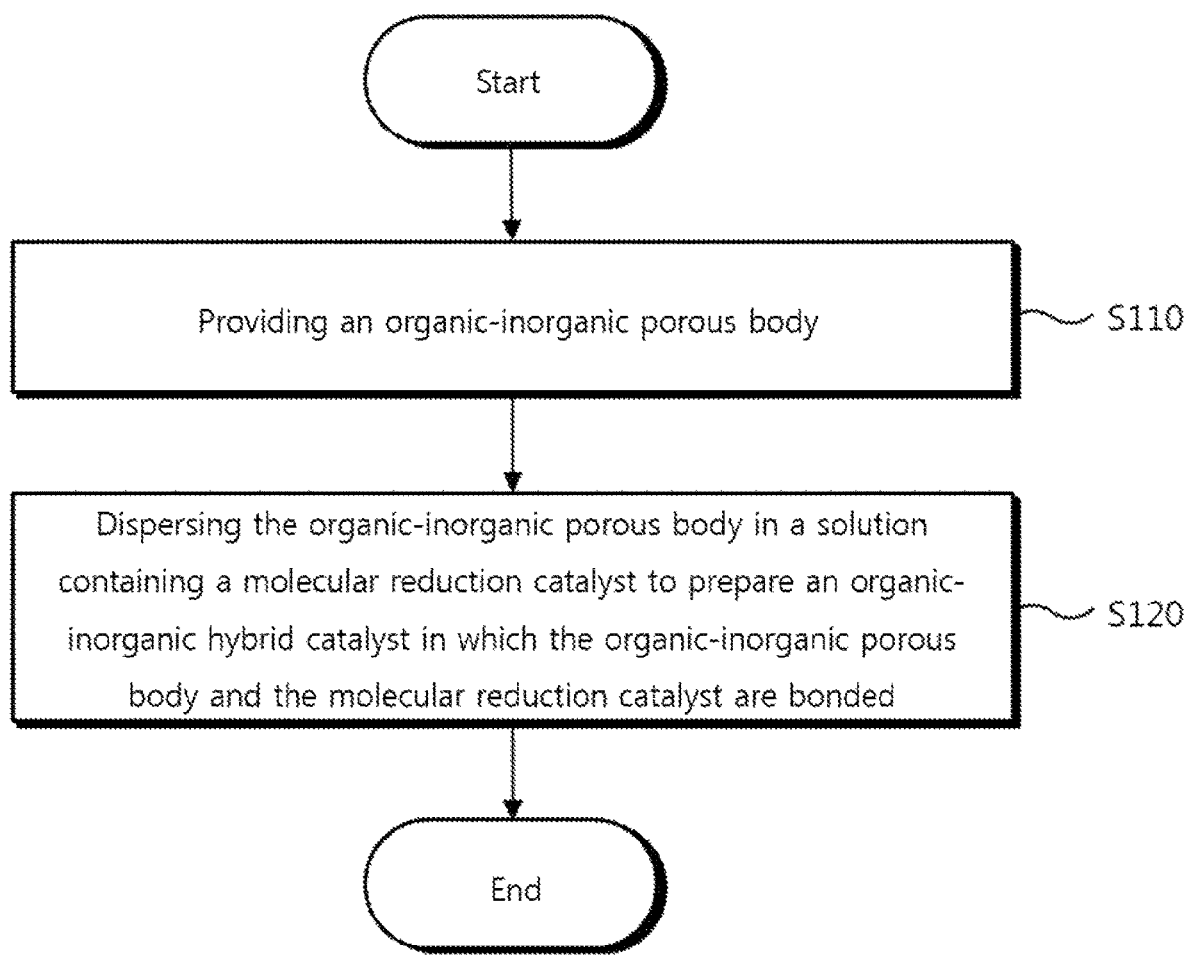

[FIG. 2]
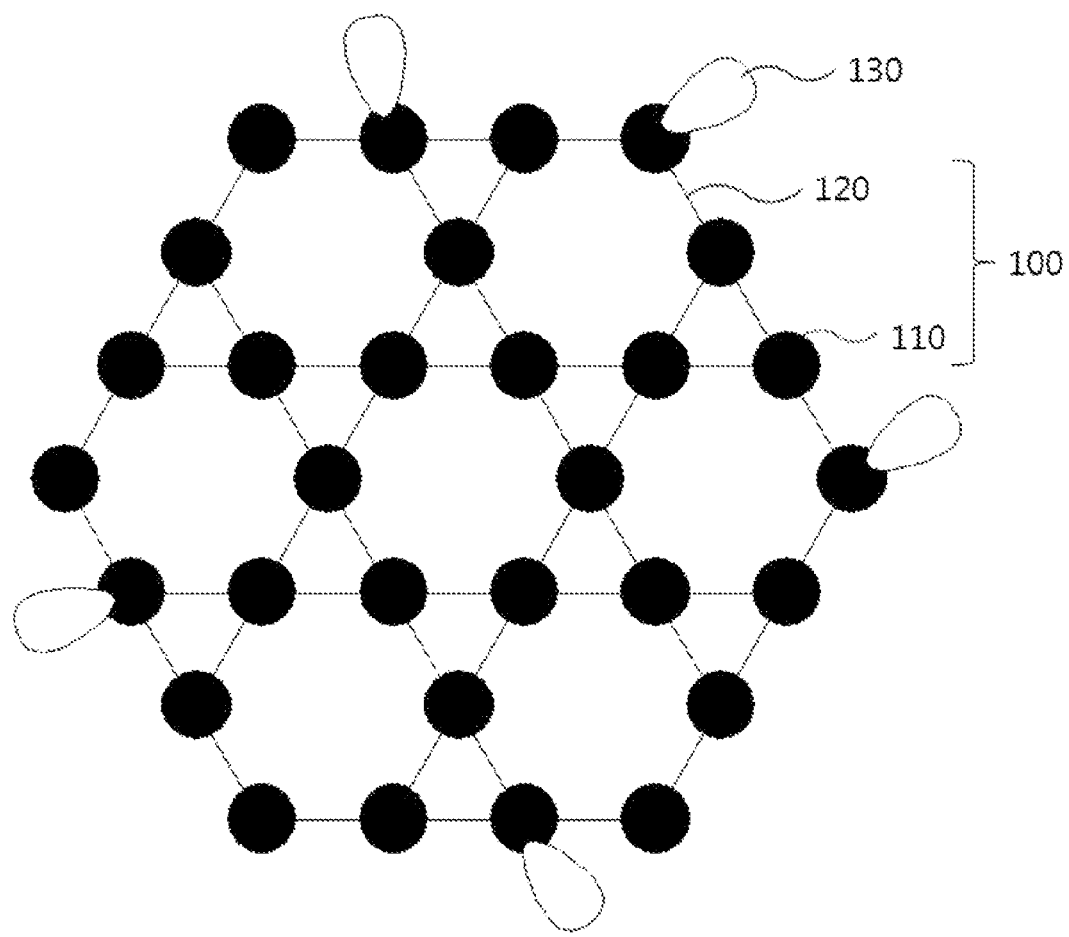

[FIG. 3]
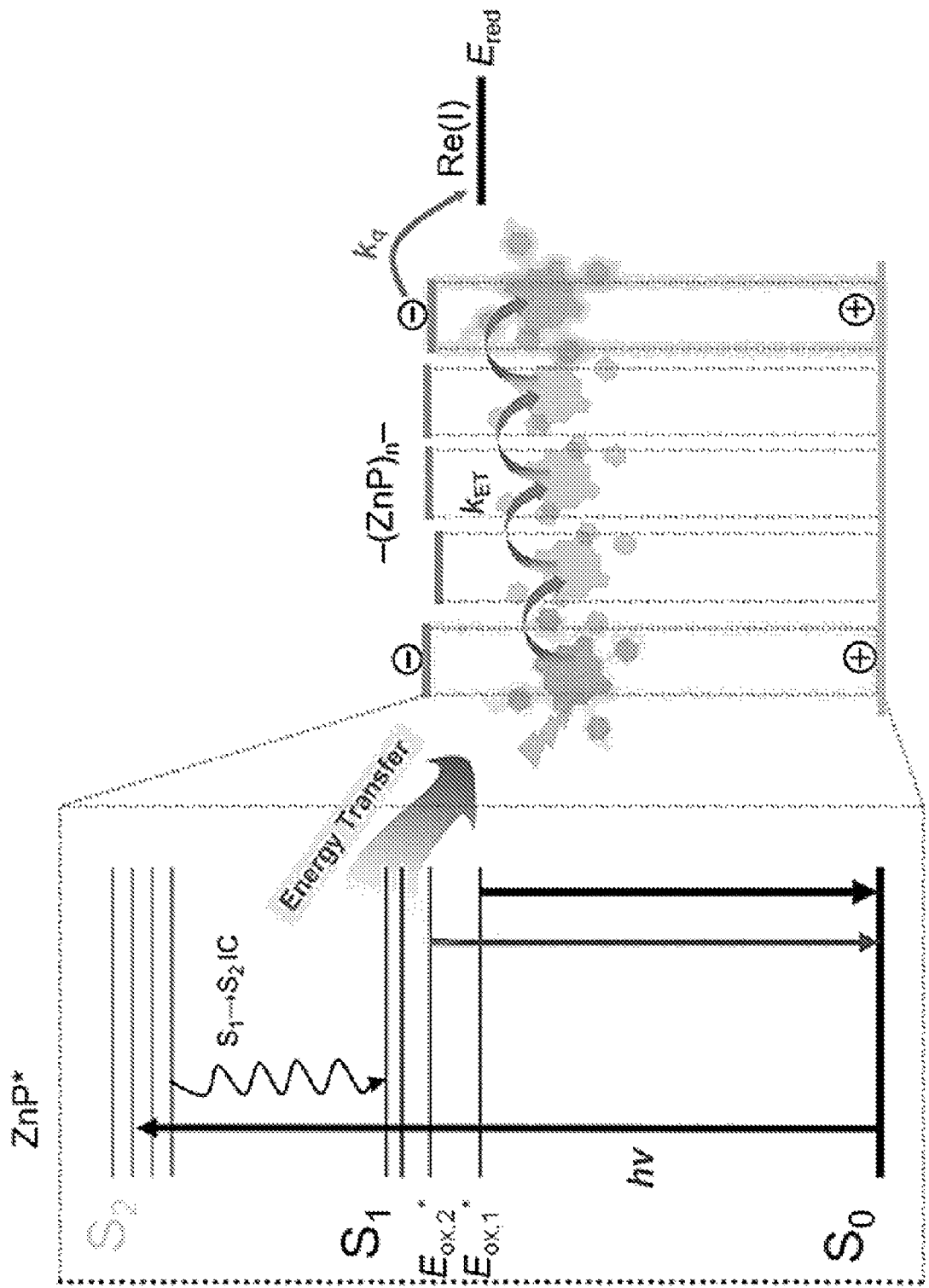

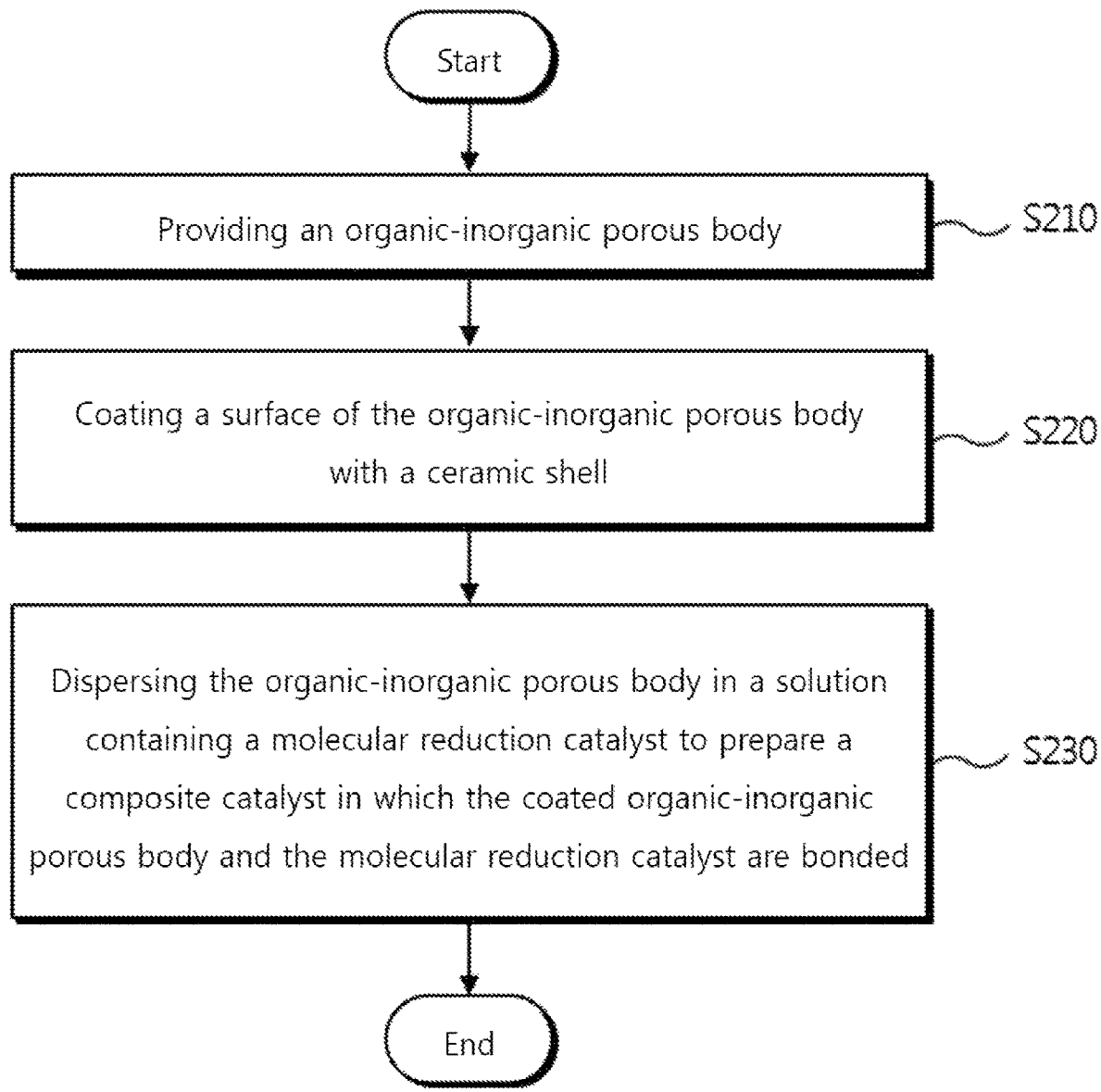

[FIG. 5]
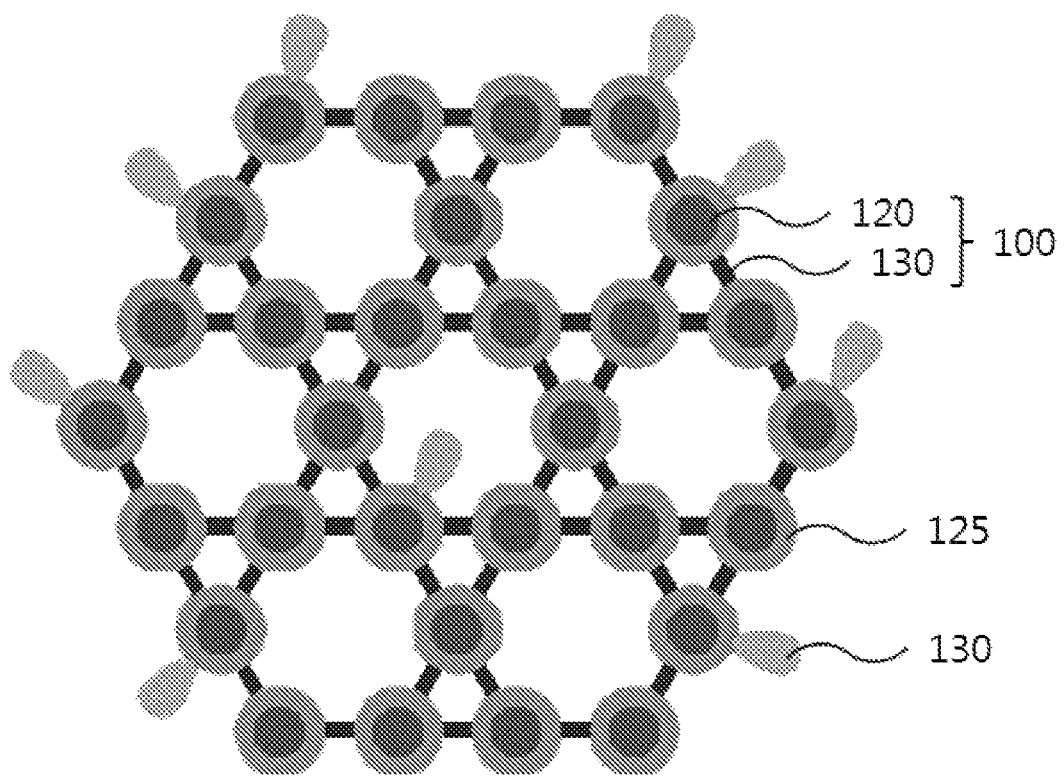

[FIG. 6]
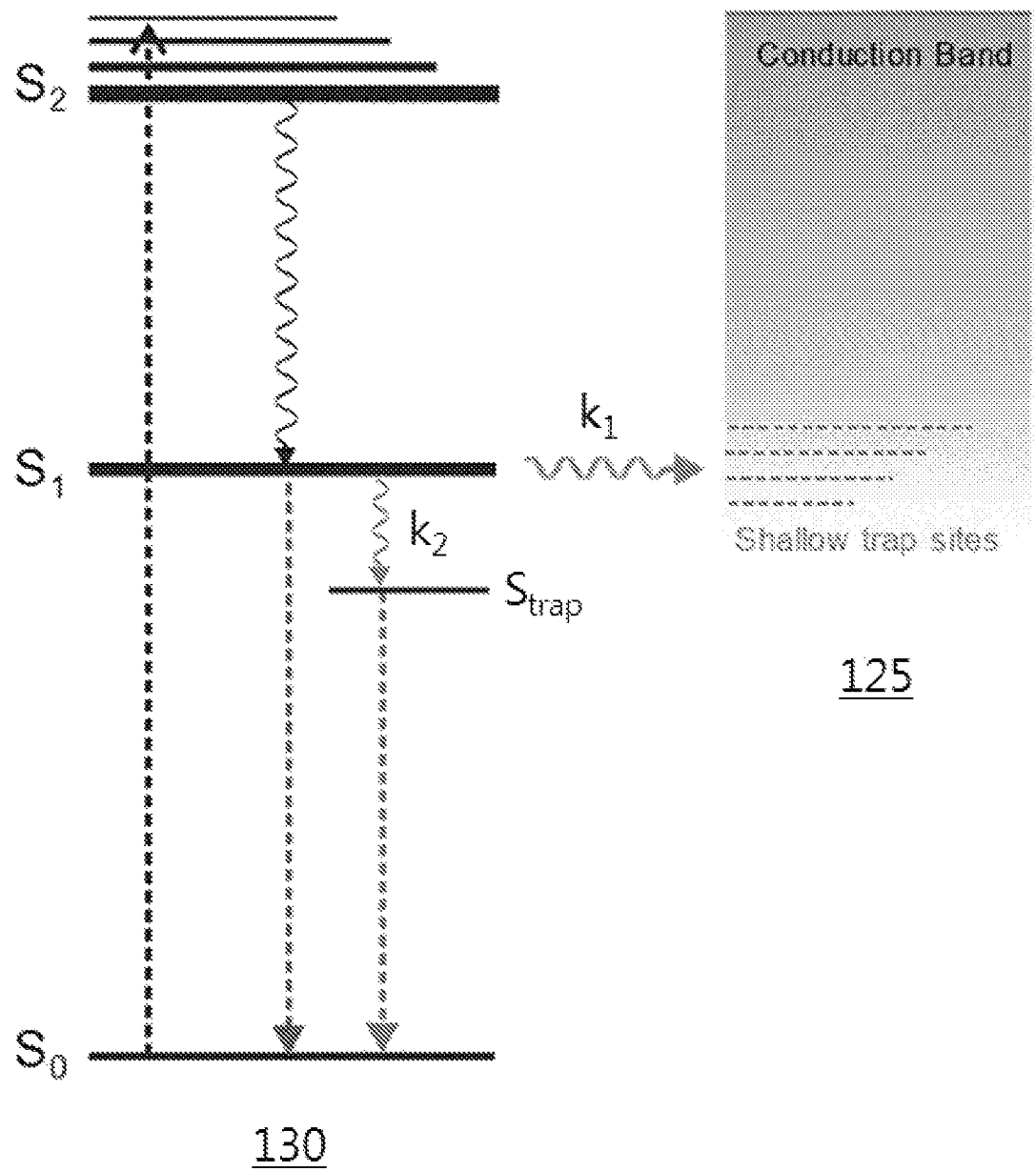

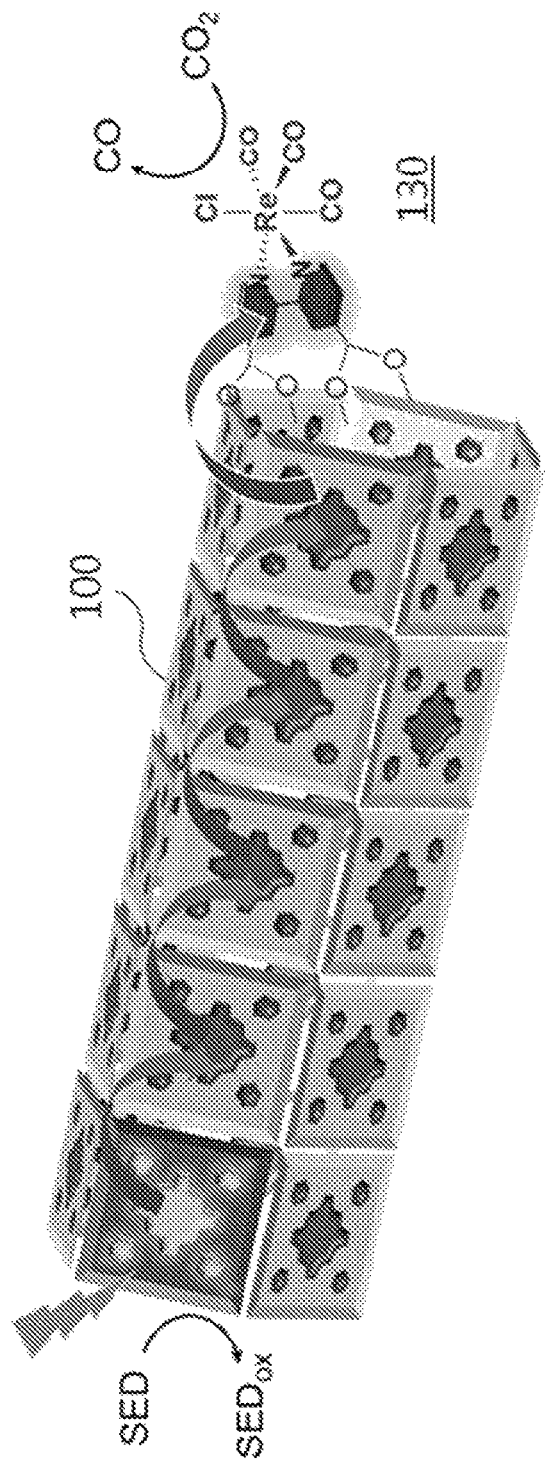
[FIG. 7]

[FIG. 8]
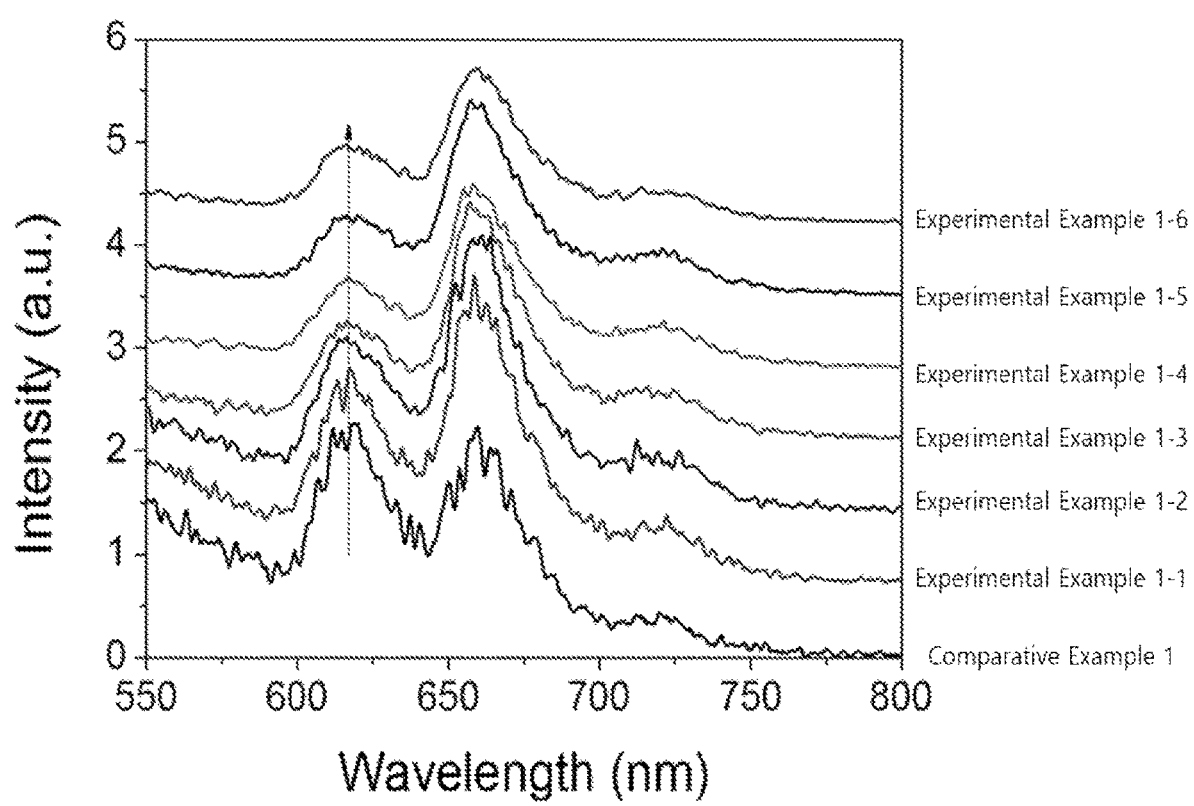

[FIG. 9]
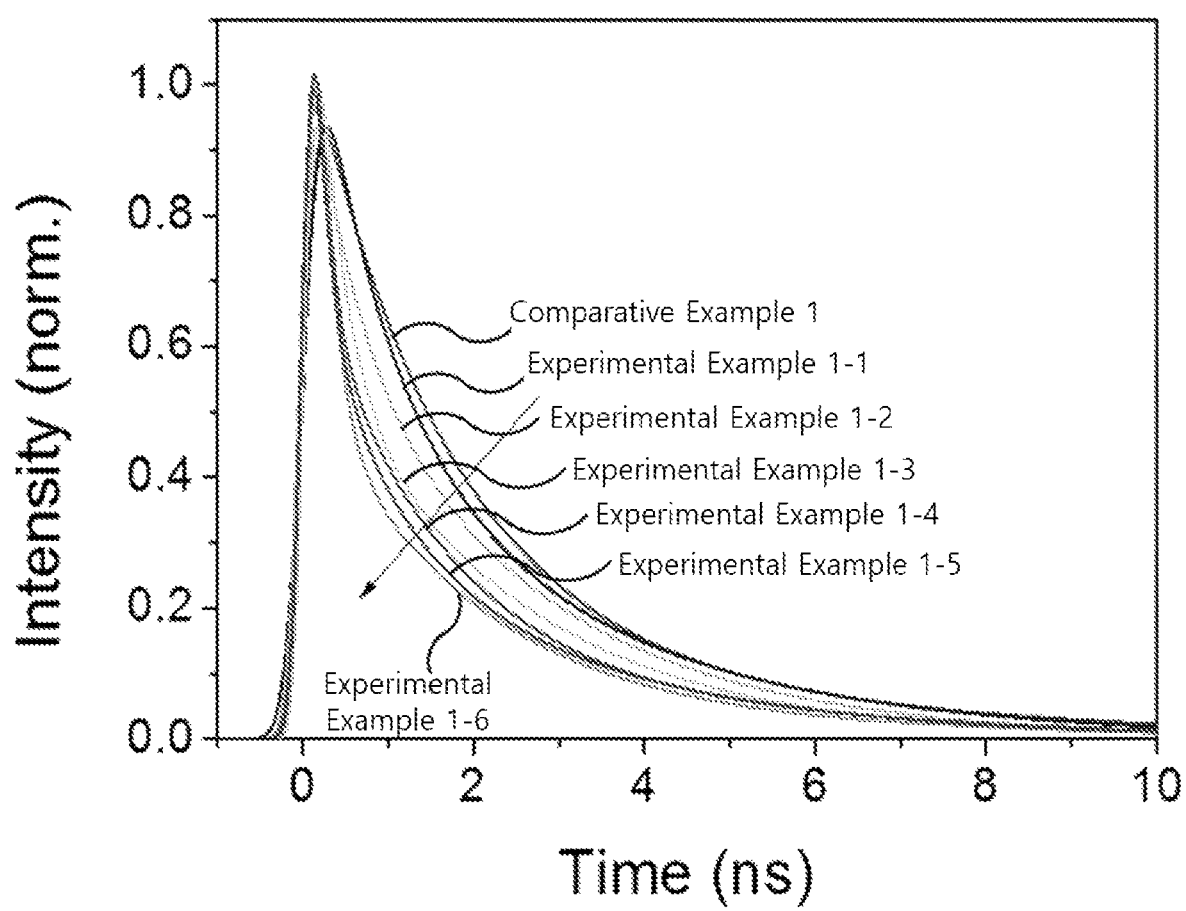

[FIG. 10]
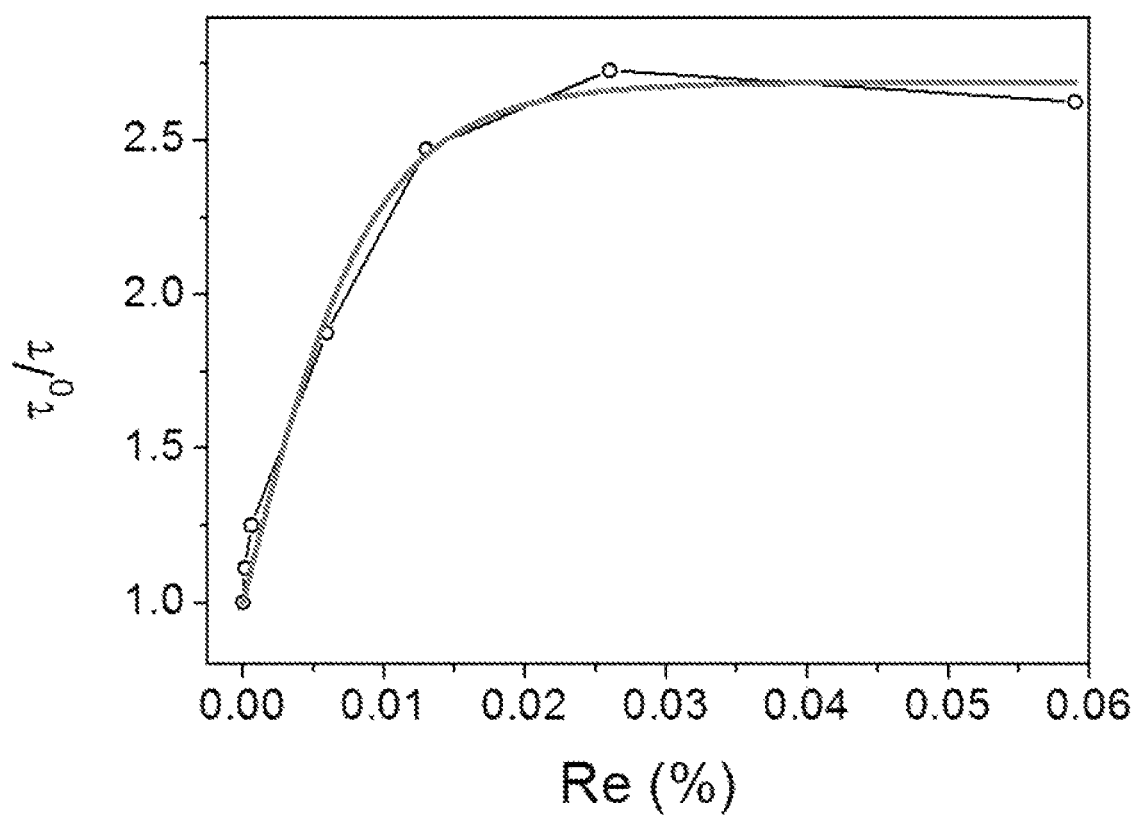

[FIG. 11]
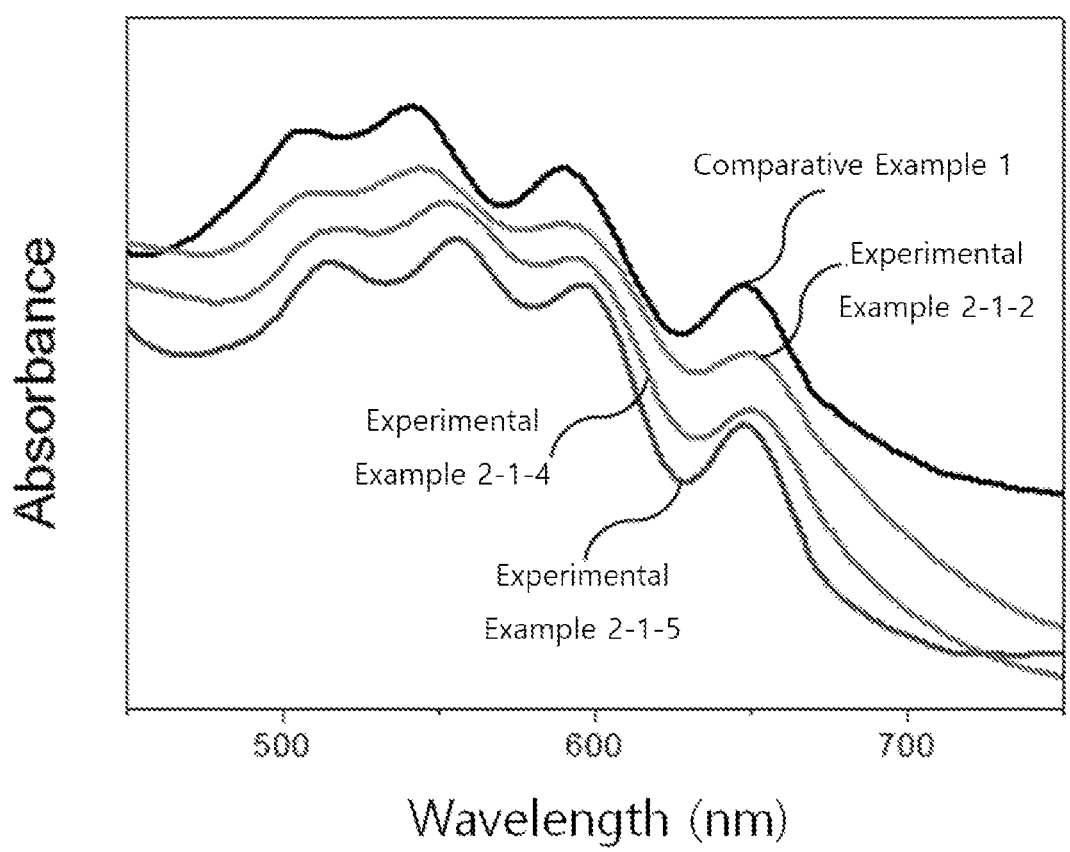

[FIG. 12]
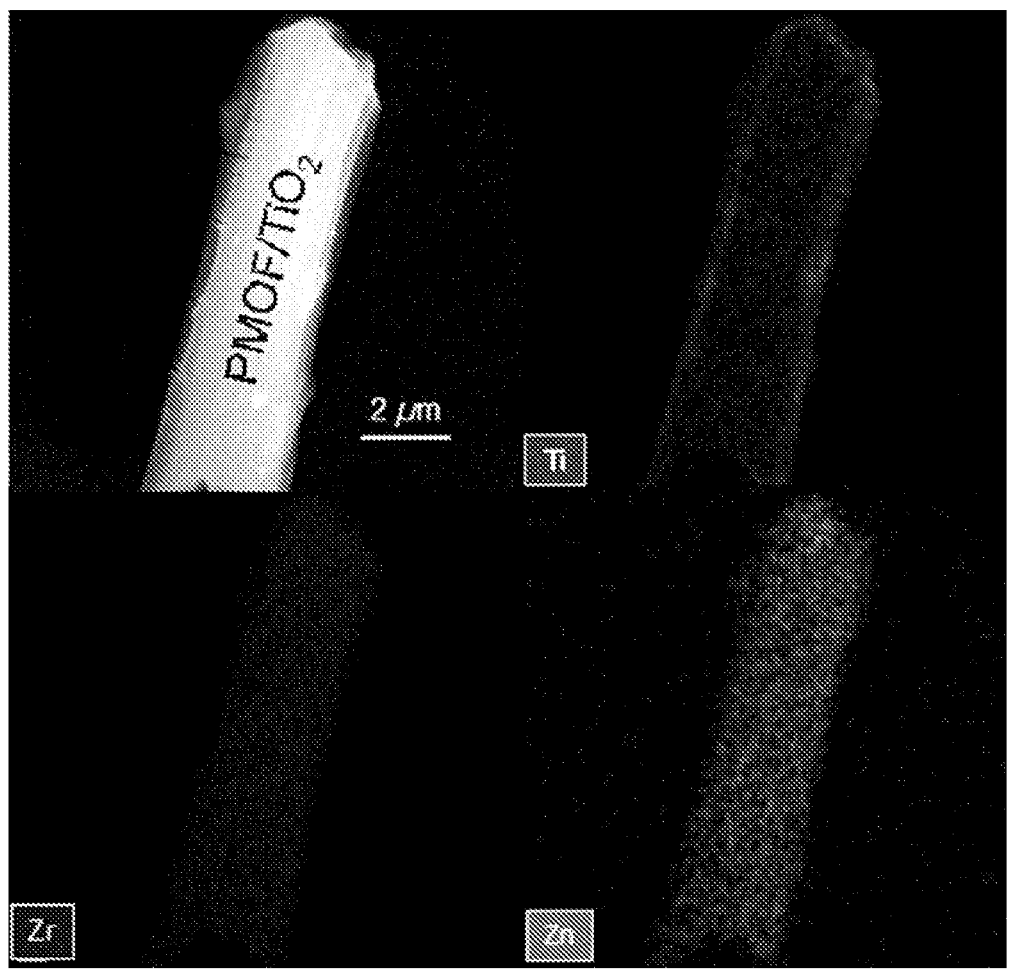

[FIG. 13]
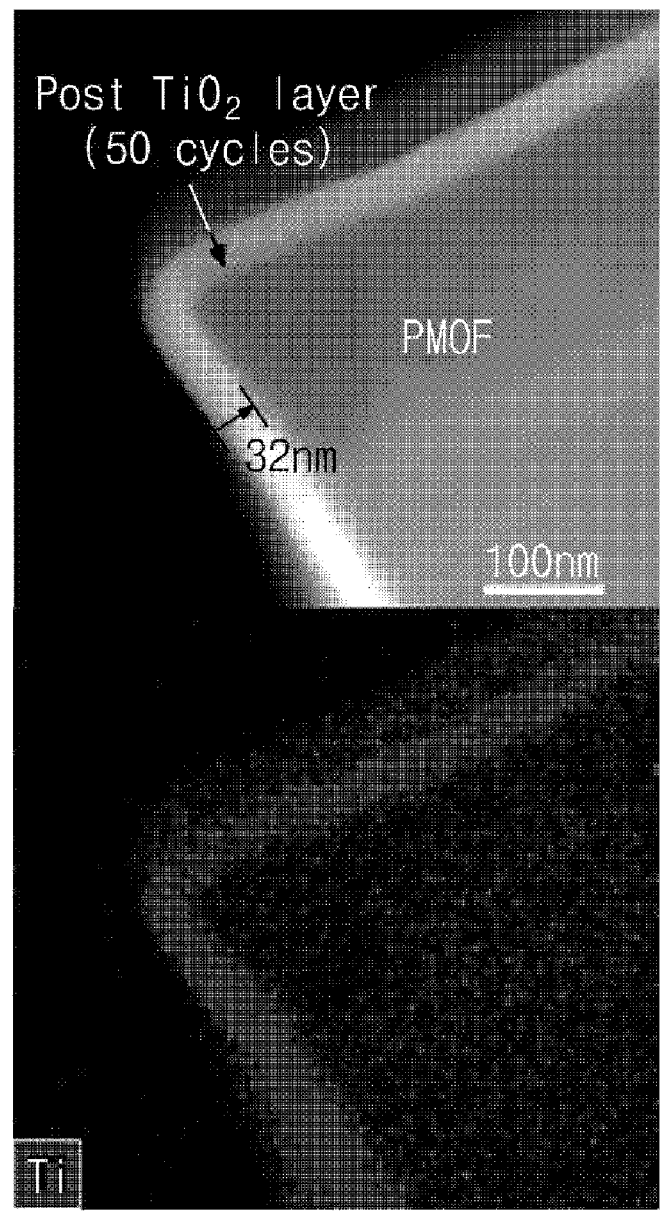

[FIG. 14]
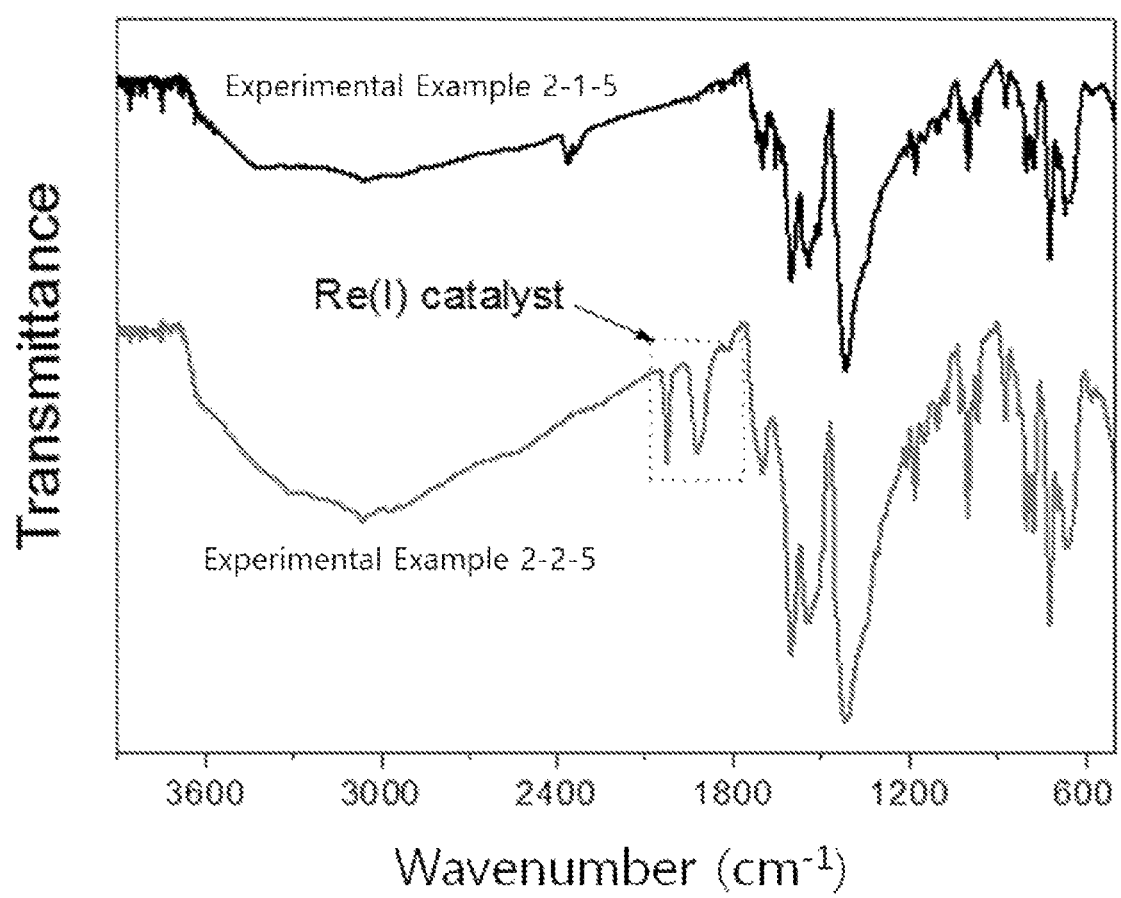

[FIG. 15]
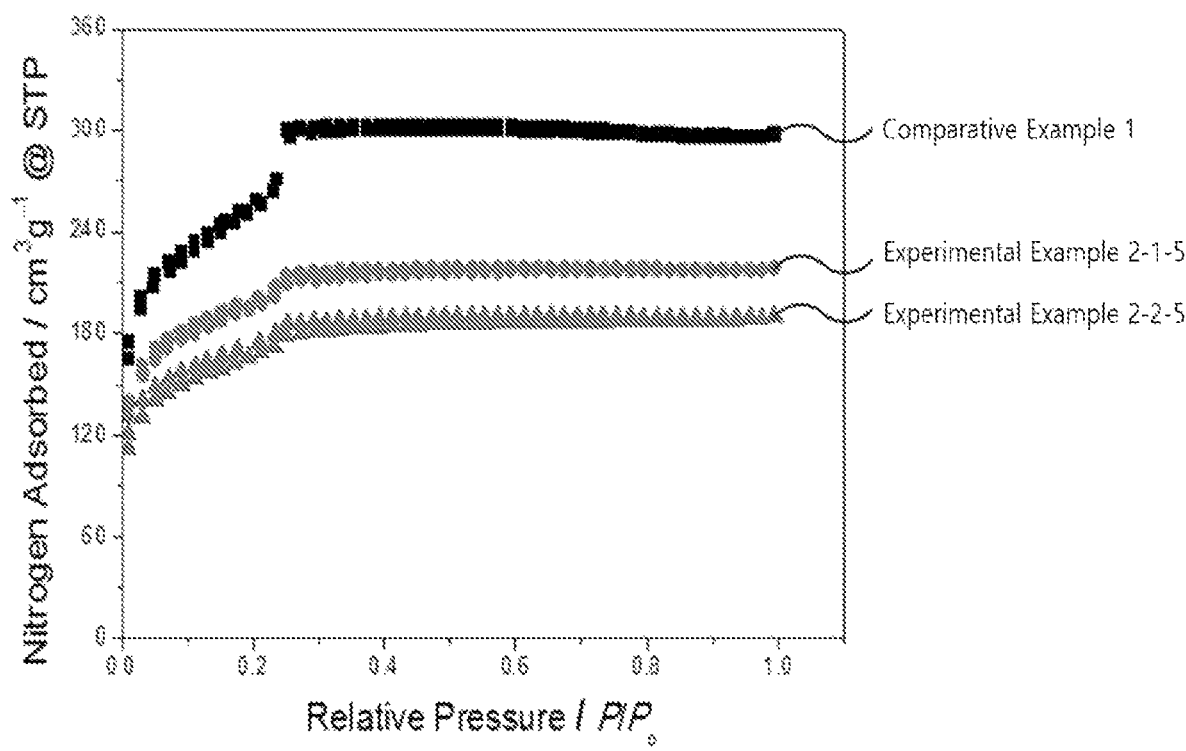

[FIG. 16]
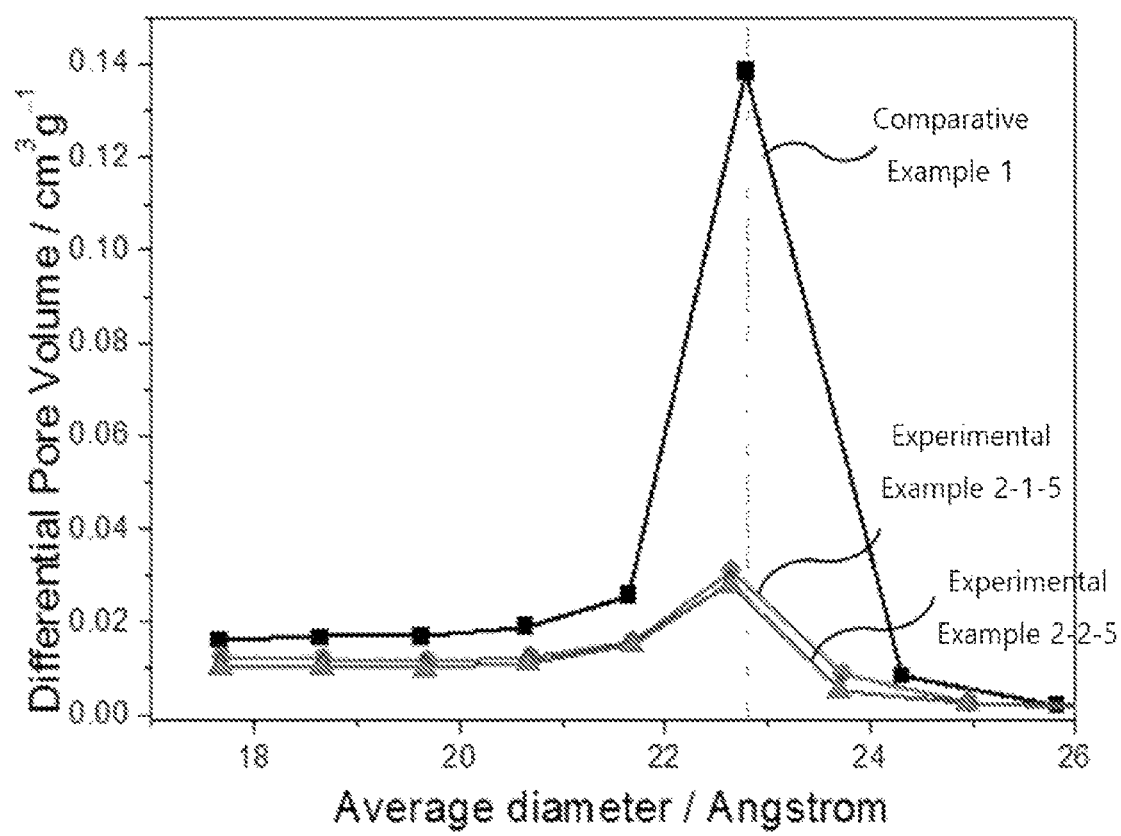

[FIG. 17]
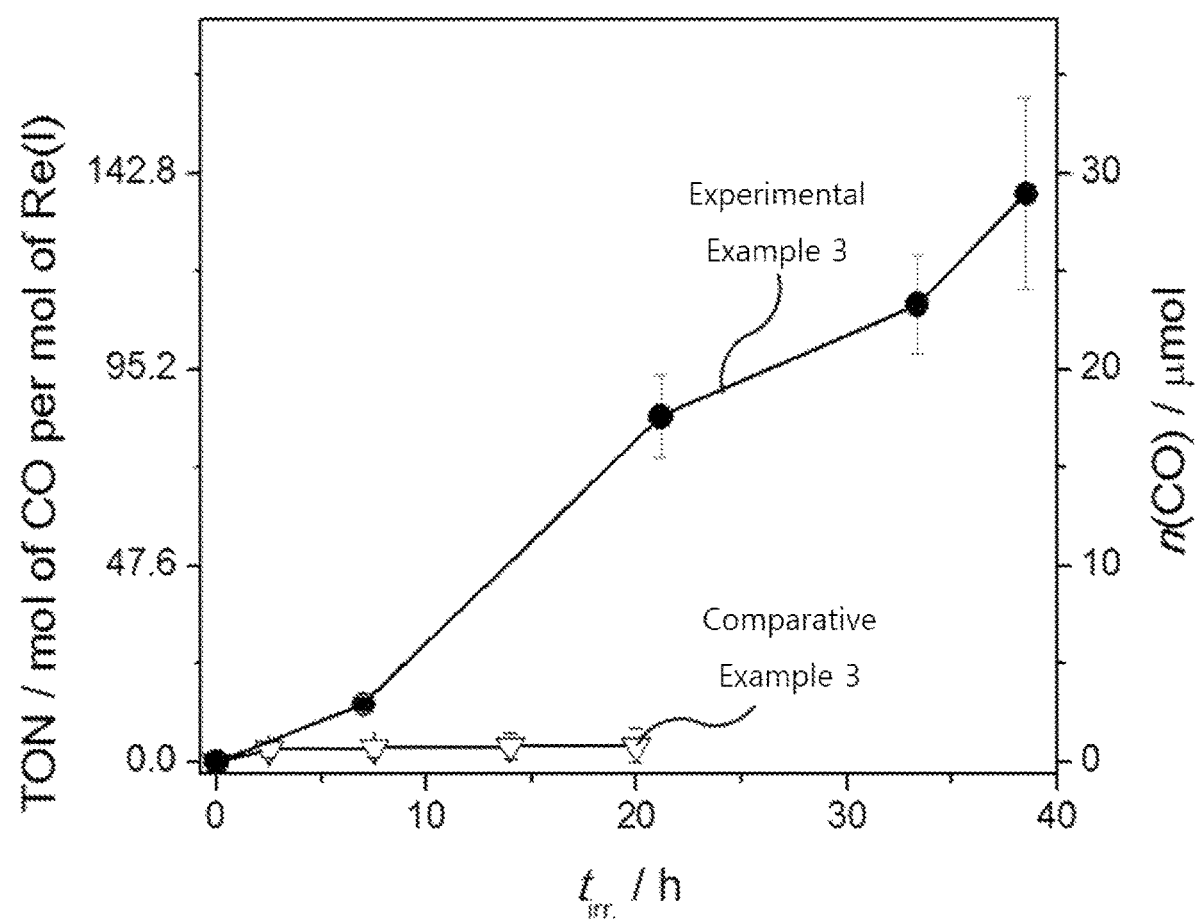

[FIG. 18]
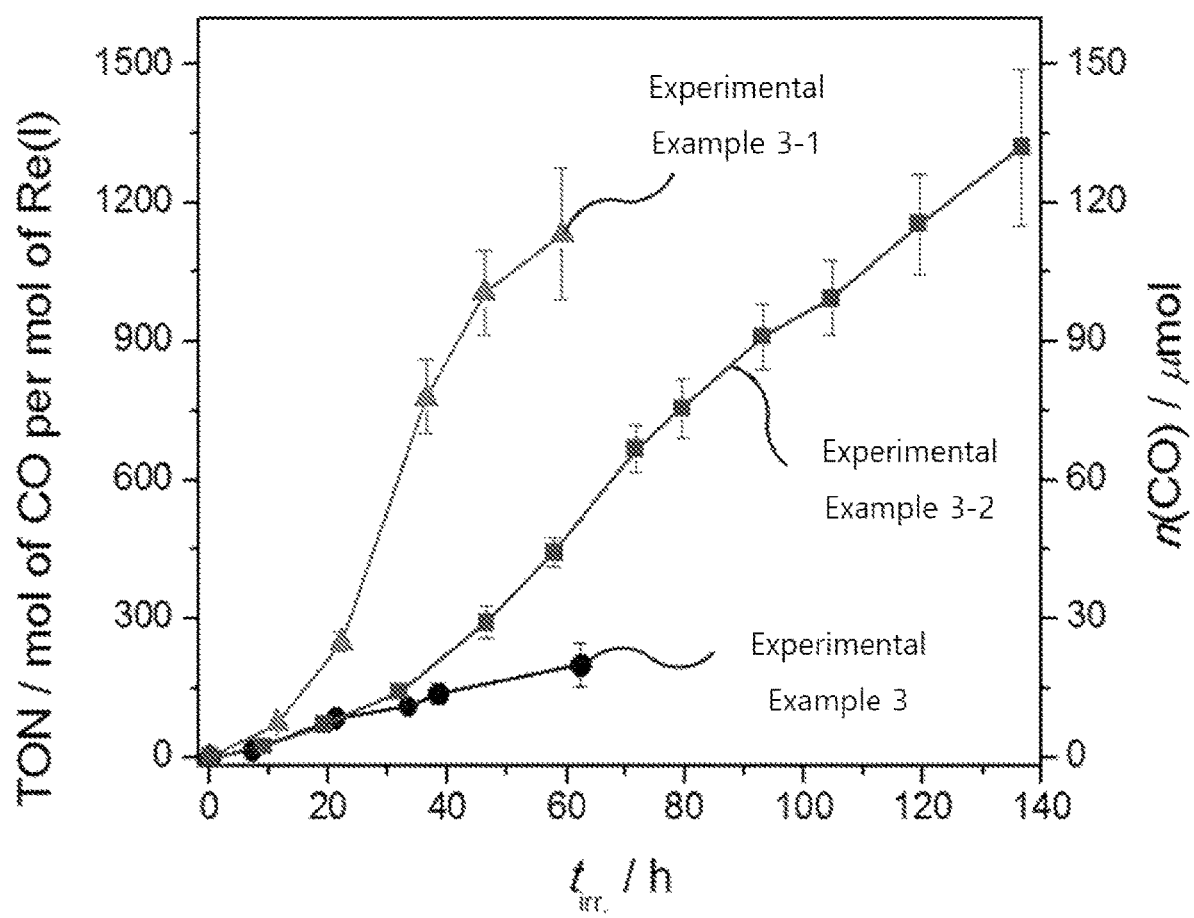

[FIG. 19]
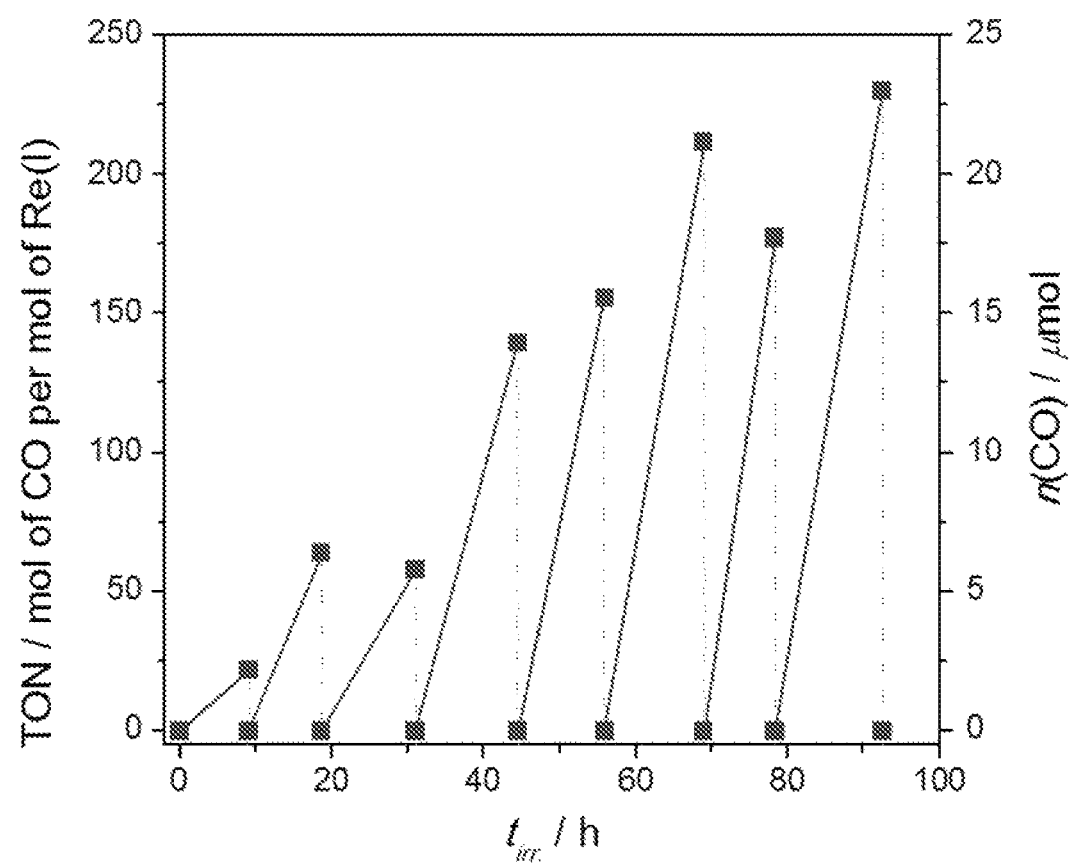

[FIG. 20]
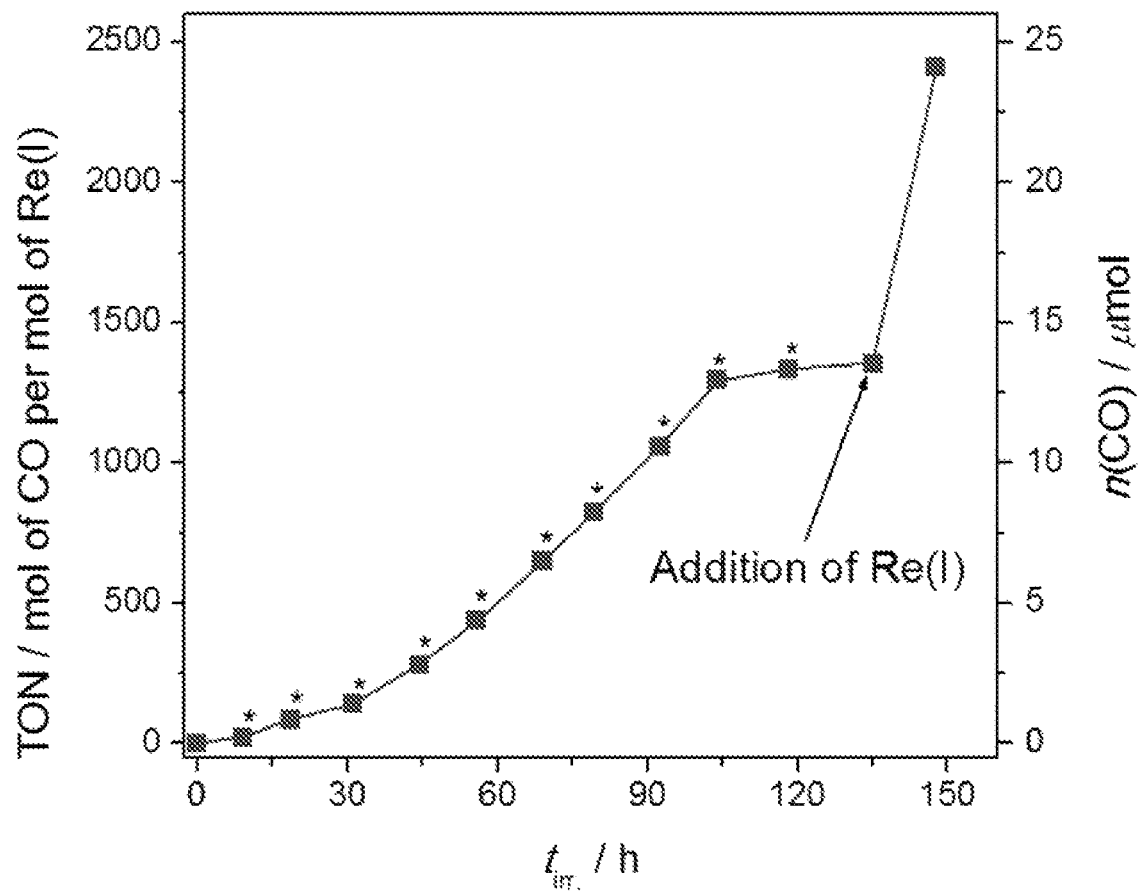

[FIG. 21]
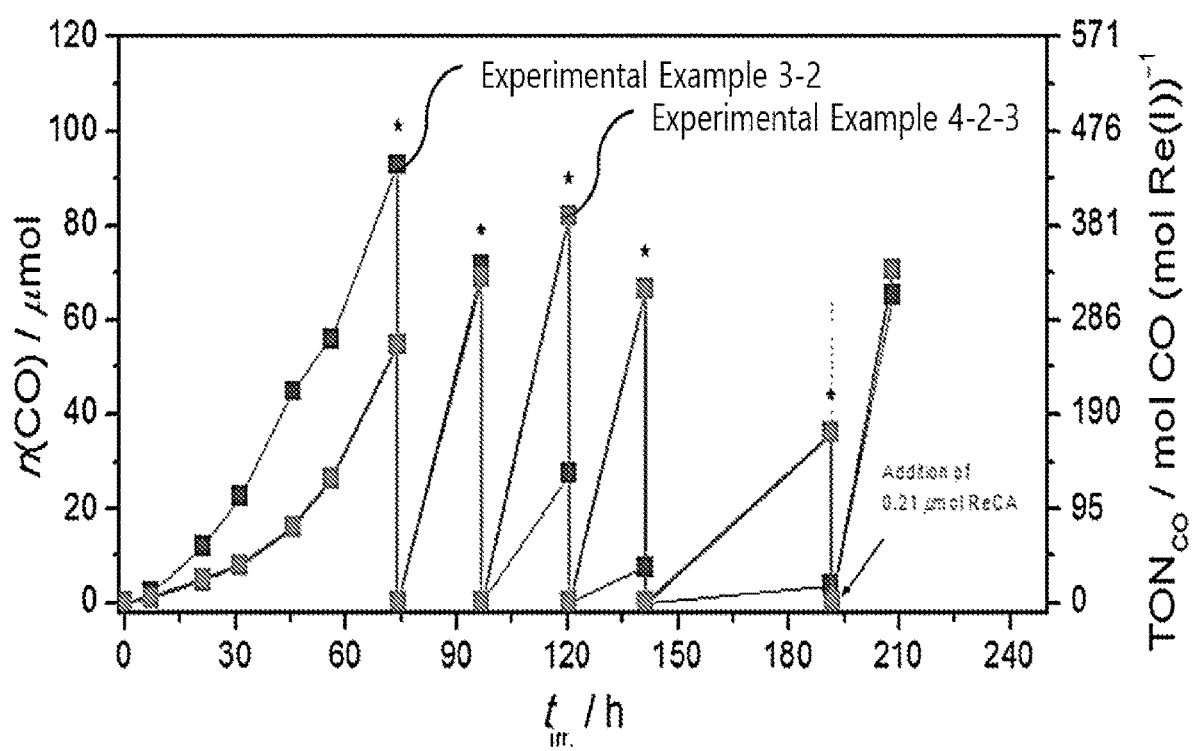

[FIG. 22]
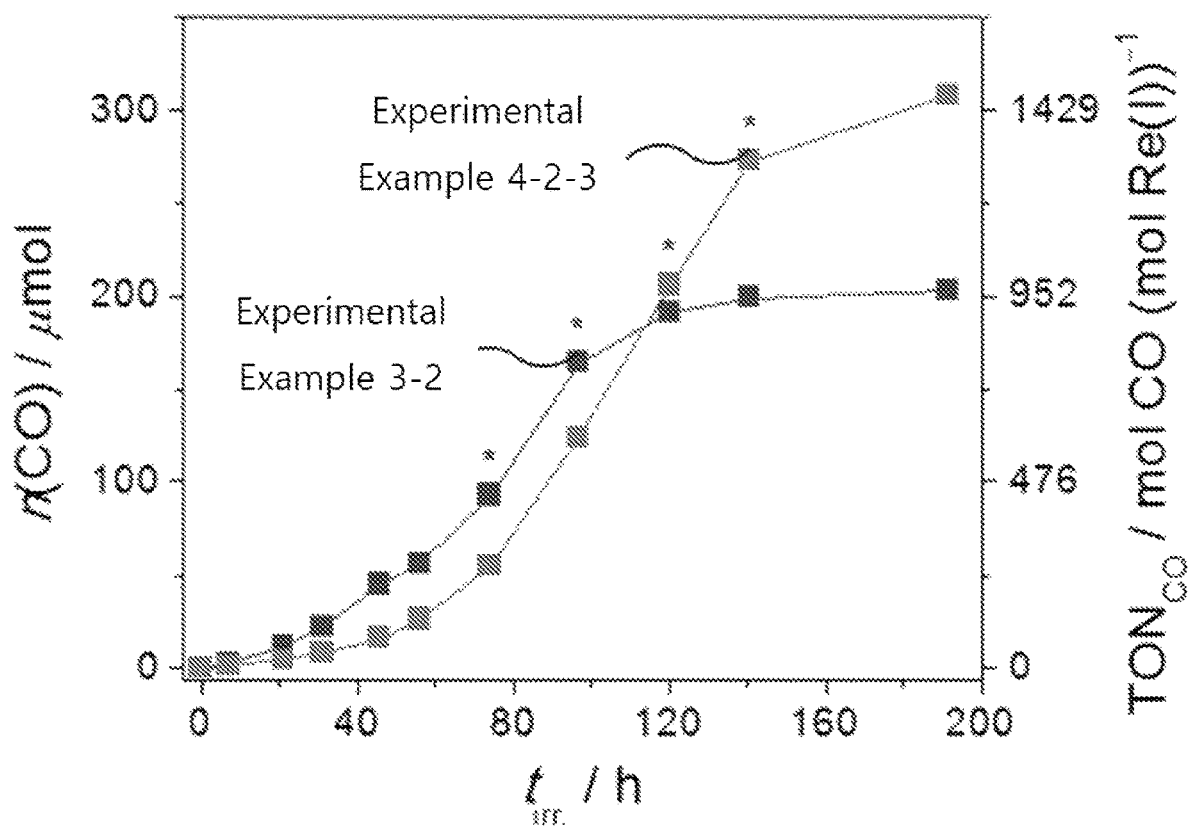

COMPOSITE CATALYST FOR CARBON DIOXIDE REDUCTION AND METHOD OF FABRICATING OF THE SAME

CROSS REFERENCE TO RELATED APPLICATION

The present application is a continuation of International Patent Application No. PCT/KR2019/011194, filed on Aug. 30, 2019, which is based upon and claims the benefit of priority to Korean Patent Application No. 10-2018-0102411, filed on Aug. 30, 2018. The disclosures of the above-listed applications are hereby incorporated by reference herein in their entirety.

TECHNICAL FIELD

The present application relates to a composite catalyst for carbon dioxide reduction and a method for preparing the same and, more particularly, to a composite catalyst for carbon dioxide reduction, which includes an organic-inorganic porous body having a linker, and a molecular reduction catalyst bonded with the organic-inorganic porous body and receiving an electron from the linker to exhibit a catalytic activity, and a method for preparing the same.

BACKGROUND ART

There have been ongoing studies for the removal of carbon dioxide due to problems such as global warming, etc. In recent years, efforts have been made to convert carbon dioxide into C1 compounds (for example, carbon monoxide (CO), methanol ($CH_3OH$), methane ($CH_4$), formic acid (HCOOH), etc.), which are useful for other industrial uses, along with the removal of carbon dioxide. Accordingly, a catalyst for converting carbon dioxide into C1 compounds has been developed by using a photocatalyst having a single or complex structure, but the efficiency of conversion into the C1 compounds is low or the catalytic efficiency is decreased due to decomposition according to use.

Thus, in order to compensate for the shortcomings of such catalyst for carbon dioxide reduction, ongoing studies have been conducted to support a catalyst for carbon dioxide reduction in a carrier. For example, Korean Patent Registration Publication No. 10-1955236 (application No. 10-2016-0128279) discloses a catalyst for preparing carbon monoxide through carbon dioxide reduction, which includes (a) a support and (b) a nanoparticle supported on the support, in which the nanoparticle is a metal nanoparticle coated with a polyimine-based polymer; the polyimine-based polymer is polyethyleneimine; the polyethyleneimine has a weight average molecular weight of 1,000 to 3,000; a supported amount of the metal nanoparticle supported on the support is 10 to 30 wt %; and the nanoparticle has a diameter of 2 to 5 nm.

DISCLOSURE

Technical Problem

One technical object of the present application is to provide a composite catalyst for carbon dioxide reduction with an enhanced catalytic activity, and a method for preparing the same.

Another technical object of the present application is to provide a composite catalyst for carbon dioxide reduction with a high efficiency of conversion into carbon monoxide, and a method for preparing the same.

Still another technical object of the present application is to provide a composite catalyst for carbon dioxide reduction having a photocatalyst with an enhanced durability, and a method for preparing the same.

The technical objects of the present application are not limited to the above.

Technical Solution

To solve the above technical objects, the present application may provide a composite catalyst for carbon dioxide reduction.

According to one embodiment, the composite catalyst for carbon dioxide reduction may comprise an organic-inorganic porous body, and a molecular reduction catalyst bonded with the organic-inorganic porous body, in which the organic-inorganic porous body includes a metal oxide cluster, and a light harvesting organic material as a linker between the metal oxide clusters, and the linker absorbs visible light to form an exciton, and moves the exciton through energy transfer between the linkers to transfer an electron of the exciton to the molecular reduction catalyst.

According to one embodiment, the organic-inorganic porous body may further comprise a ceramic shell surrounding a surface, and the electron of the exciton formed by the linker may be transferred to the molecular reduction catalyst through the metal oxide cluster coated with the ceramic shell.

According to one embodiment, the ceramic shell may include at least one of metal oxide or metal sulfide.

According to one embodiment, the metal oxide may include at least one of titanium oxide, zinc oxide, tin oxide, aluminum oxide, iron oxide, zirconium oxide, or hafnium oxide.

According to one embodiment, the metal sulfide may include at least one of zinc sulfide, cadmium sulfide, or tin sulfide.

According to one embodiment, the linker may include at least one of a metal-porphyrin derivative, a squaraine derivative, or a metal complex compound.

According to one embodiment, the molecular reduction catalyst may be a metal complex compound having at least one metal element out of rhenium (Re), rubidium (Ru), manganese (Mn), cobalt (Co), nickel (Ni), iron (Fe), or iridium (Ir).

According to one embodiment, the molecular reduction catalyst may be bonded with the organic-inorganic porous body through any one functional group of a carboxyl group (COOH), a phosphate group ($PO_3H_2$), or a CNCOON group.

According to one embodiment, the metal oxide cluster may be a zirconium oxide cluster ($Zr_6O_8$).

To solve the above technical objects, the present application may provide a catalytic composition for carbon dioxide reduction.

According to one embodiment, the catalytic composition for carbon dioxide reduction may include the composite catalyst for carbon dioxide reduction, and a sacrificial electron donor.

According to one embodiment, the sacrificial electron donor may be at least one of 1,3-dimethyl-2-phenyl-1,3-dihydrobenzimidazole (BIH), or triethanolamine (TEOA).

According to one embodiment, at least one additive of 2,2,2-trifluoroethanol (TFE), or water may be further added.

To solve the above technical objects, the present application may provide a method for preparing a composite catalyst for carbon dioxide reduction.

According to one embodiment, the method for preparing a composite catalyst for carbon dioxide reduction may include: providing an organic-inorganic porous body; and dispersing the organic-inorganic porous body in a solution containing a molecular reduction catalyst to prepare a composite catalyst in which the organic-inorganic porous body and the molecular reduction catalyst are bonded, in which the organic-inorganic porous body may include a metal oxide cluster, and a light harvesting organic material as a linker between the metal oxide clusters, and the linker may absorb visible light to form an exciton, and move the exciton through energy transfer between the linkers to transfer an electron of the exciton to the molecular reduction catalyst.

According to one embodiment, the molecular reduction catalyst may be mixed in a range of 0.01% or more compared to the organic-inorganic porous body.

According to one embodiment, the method may further include coating a surface of the organic-inorganic porous body with a ceramic shell after providing the organic-inorganic porous body, in which the electron of the exciton formed by the linker may be transferred to the molecular reduction catalyst through the metal oxide cluster coated with the ceramic shell.

According to one embodiment, the coating with the ceramic shell may be performed by an atomic layer deposition method.

According to one embodiment, the coating with the ceramic shell may include charging the organic-inorganic porous body into a chamber; providing a metal precursor into the chamber; and providing an oxygen precursor into the chamber to react the metal precursor bonded with the surface of the organic-inorganic porous body with the oxygen precursor, in which the providing of the metal precursor and the providing of the oxygen precursor may be defined as one unit process and the unit process may be repeatedly performed.

According to one embodiment, the unit process may be performed in a range of 15 to 25 times.

According to one embodiment, the metal precursor may be titanium isopropoxide (TTIP).

According to one embodiment, the oxygen precursor may be water.

Advantageous Effects

According to a first embodiment of the present invention, a composite catalyst for carbon dioxide reduction can include an organic-inorganic porous body, and a molecular reduction catalyst bonded with the organic-inorganic porous body.

The organic-inorganic porous body can include a metal oxide cluster and a light harvesting organic material as a linker between the metal oxide clusters.

The linker can absorb visible light to form an exciton, and move the exciton through energy transfer between the linkers to transfer an electron of the exciton to the molecular reduction catalyst. In addition, the linker can be arranged at regular intervals through the metal oxide cluster, and thus the exciton can easily move along the linker so as to reduce an energy loss of the exciton.

The molecular reduction catalyst can provide an electron received from the exciton to carbon dioxide so as to reduce the carbon dioxide. In this case, as described above, the energy loss of the exciton can be minimized, and thus the amount of electrons transferred to the molecular reduction catalyst can be maximized. Accordingly, the catalytic activity of the composite catalyst according to the first embodiment can be easily enhanced through the molecular reduction catalyst.

In addition, according to a second embodiment of the present invention, a composite catalyst for carbon dioxide reduction can include an organic-inorganic porous body, a ceramic shell surrounding a surface of the organic-inorganic porous body, and a molecular reduction catalyst bonded with the surface of the organic-inorganic porous body coated with the ceramic shell. In other words, according to the second embodiment, the composite catalyst for carbon dioxide reduction can further include the ceramic shell on the surface of the organic-inorganic porous body compared to the composite catalyst for carbon dioxide reduction according to the first embodiment.

The ceramic shell can be prepared on the surface of the organic-inorganic porous body by an atomic layer deposition method, and specifically the providing of a metal precursor and the providing of an oxygen precursor can be repeatedly performed and thus the ceramic shell can be coated on the surface of the organic-inorganic porous body. In this case, the metal precursor can be adsorbed onto a surface of the metal oxide cluster more easily than the linker, and thus the ceramic shell can be formed mainly on the surface of the metal oxide cluster.

As described above, the linker can absorb visible light to form an exciton. However, unlike the composite catalyst for carbon dioxide reduction according to the first embodiment, the rate at which the exciton provides an electron to the ceramic shell coated on the metal oxide cluster can be faster than the rate at which the exciton moves along the linker.

Accordingly, in the composite catalyst for carbon dioxide reduction according to the second embodiment, the electron of the exciton formed by the linker can be moved to the molecular reduction catalyst through the ceramic shell coated on the metal oxide cluster. As described above, the molecular reduction catalyst can provide the received electron to carbon dioxide so as to reduce the carbon dioxide.

DESCRIPTION OF DRAWINGS

FIG. 1 is a flowchart for explaining a method for preparing a composite catalyst for carbon dioxide reduction according to a first embodiment of the present invention.

FIG. 2 is a structural formula showing a composite catalyst for carbon dioxide reduction according to a first embodiment of the present invention.

FIG. 3 is an energy band diagram showing a moving path of light energy irradiated onto a composite catalyst for carbon dioxide reduction according to a first embodiment of the present invention.

FIG. 4 is a flowchart for explaining a method for preparing a composite catalyst for carbon dioxide reduction according to a second embodiment of the present invention.

FIG. 5 is a structural formula showing a composite catalyst for carbon dioxide reduction according to a second embodiment of the present invention.

FIG. 6 is an energy band diagram showing a moving path of light energy irradiated onto a composite catalyst for carbon dioxide reduction according to a second embodiment of the present invention.

FIG. 7 is a view showing a moving path of light energy irradiated onto a catalytic composition for carbon dioxide reduction according to a first embodiment of the present invention.

FIG. 8 is a view showing a steady-state luminescence spectrum depending on a concentration of a molecular reduction catalyst of a composite catalyst according to an embodiment of the present invention.

FIG. 9 is a view showing a time-resolved photoluminescence (TRPL) spectrum depending on a concentration of a molecular reduction catalyst of a composite catalyst for carbon dioxide reduction according to an embodiment of the present invention.

FIG. 10 is a view showing a Stern-Volmer plot depending on a concentration of a molecular reduction catalyst of a composite catalyst according to an embodiment of the present invention.

FIG. 11 is a view showing an absorbance of a coated organic-inorganic porous body according to an embodiment of the present invention.

FIGS. 12 and 13 are views showing a transmission electronic microscopy (TEM) image and an elemental distribution of a coated organic-inorganic porous body according to an embodiment of the present invention.

FIG. 14 is a view showing a transmittance of a coated organic-inorganic porous body and a composite catalyst for carbon dioxide reduction according to an embodiment of the present invention.

FIG. 15 is a view showing a nitrogen adsorbed curve of a coated organic-inorganic porous body and a composite catalyst for carbon dioxide reduction according to an embodiment of the present invention.

FIG. 16 is a view showing a pore distribution of a coated organic-inorganic porous body and a composite catalyst for carbon dioxide reduction according to an embodiment of the present invention.

FIGS. 17 and 18 are views showing an amount of carbon monoxide produced with time from a catalytic composition for carbon dioxide reduction according to an embodiment of the present invention.

FIG. 19 is a view showing an amount of carbon monoxide produced depending on a cycle of a catalytic composition for carbon dioxide reduction according to an embodiment of the present invention.

FIG. 20 is a view showing an amount of carbon monoxide produced depending on an addition of a molecular reduction catalyst due to an inactivated catalytic composition for carbon dioxide reduction according to Experimental Example 3-2 of the present invention.

FIG. 21 is a view showing an efficiency of generation of carbon monoxide per catalyst of a catalytic composition for carbon dioxide reduction according to an embodiment of the present invention.

FIG. 22 is a view showing a generation amount of carbon monoxide added up compared to a total reaction time of a catalytic composition for carbon dioxide reduction according to an embodiment of the present invention.

MODE FOR INVENTION

Hereinafter, preferred embodiments of the present invention will be described in detail with reference to the accompanying drawings. However, the technical spirit of the present invention is not limited to the embodiments, but may be realized in different forms. The embodiments introduced herein are provided to sufficiently deliver the spirit of the present invention to those skilled in the art so that the disclosed contents may become thorough and complete.

When it is mentioned in the specification that one element is on another element, it means that the first element may be directly formed on the second element or a third element may be interposed between the first element and the second element. Further, in the drawings, the thicknesses of the membrane and areas are exaggerated for efficient description of the technical contents.

Further, in the various embodiments of the present invention, the terms such as first, second, and third are used to describe various elements, but the elements are not limited to the terms. The terms are used only to distinguish one element from another element. Accordingly, an element mentioned as a first element in one embodiment may be mentioned as a second element in another embodiment. The embodiments illustrated here include their complementary embodiments. Further, the term "and/or" in the specification is used to include at least one of the elements enumerated in the specification.

In the specification, the terms of a singular form may include plural forms unless otherwise specified. Further, the terms "including" and "having" are used to designate that the features, the numbers, the steps, the elements, or combinations thereof described in the specification are present, and are not to be understood as excluding the possibility that one or more other features, numbers, steps, elements, or combinations thereof may be present or added.

Further, in the following description of the present invention, a detailed description of known functions or configurations incorporated herein will be omitted when it may make the subject matter of the present invention unnecessarily unclear.

FIG. 1 is a flowchart for explaining a method for preparing a composite catalyst for carbon dioxide reduction according to an embodiment of the present invention, FIG. 2 is a structural formula showing a composite catalyst for carbon dioxide reduction according to an embodiment of the present invention, and FIG. 3 is an energy band diagram showing a moving path of light energy irradiated onto a composite catalyst for carbon dioxide reduction according to a first embodiment of the present invention.

Referring to FIG. 1, an organic-inorganic porous body 100 may be provided (S110).

The organic-inorganic porous body 100 may include a metal oxide cluster 110 and a linker between the metal oxide clusters 110. The linker 120 may be a light harvesting organic material. In other words, the linker 120 may absorb light in a visible light region, and thus an exciton may be formed in the linker 120. That is to say, the linker 120 may receive the light energy, which is irradiated onto the linker 120, and thus an electron may be excited from a HOMO level to a LUMO level, so as to form the exciton in which the excited electron and a hole at the HOMO level make a pair.

In general, at least one of a singlet exciton or a triplet exciton may be formed in the linker 120 by light energy. Accordingly, the singlet exciton may move along the linker 120 due to an interaction between the induced dipoles (i.e., Forstoer energy transfer). Alternatively, at least one of the singlet exciton or the triplet exciton may move along the linker 120 due to direct exchange of spins between the linkers 120 (i.e., Dexter energy transfer). In other words, the exciton may be easily moved due to energy transfer between the linkers 120.

According to one embodiment, the metal oxide cluster 110 may be a zirconium oxide ($Zr_6O_8$).

According to one embodiment, the linker 120 may be zinc-porphyrin (ZnP) represented by <Formula 1> below.

<Formula 1>

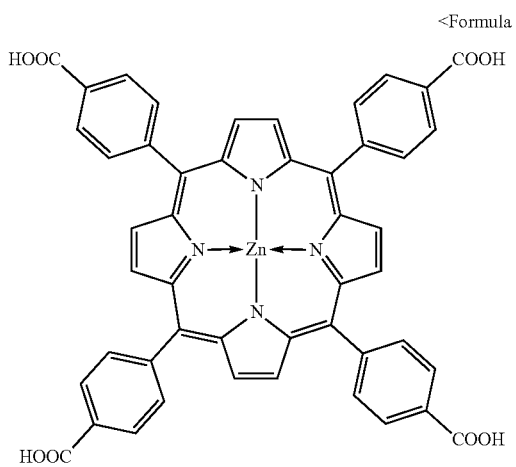

According to another embodiment, the linker 120 may be a squaraine derivative represented by <Formula 2> below.

<Formula 2>

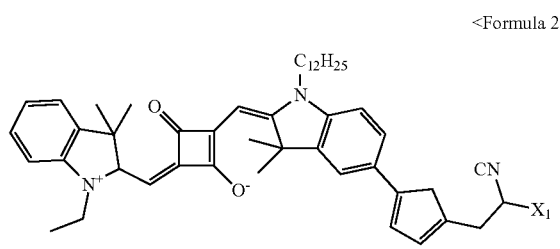

In this case, the $X_1$ may be at least one of a carbonyl group (COOH) or a phosphate group ($PO_3H_2$).

According to still another embodiment, the linker 120 may be a thiophene-amine-based organic dye represented by <Formula 3> below.

<Formula 3>

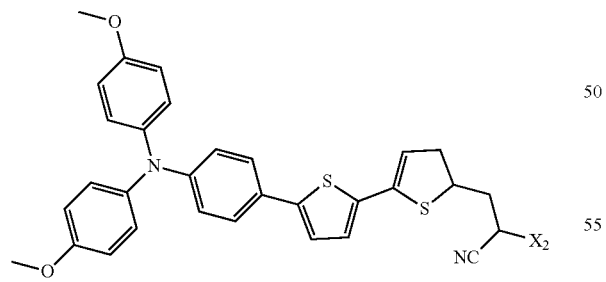

In this case, the $X_2$ may be at least one of a carbonyl group (COOH) or a phosphate group ($PO_3H_2$).

According to still another embodiment, the linker 120 may be a metal complex compound having any one metal element of iridium (Ir) or rhenium (Re). For example, the linker 120 may be an iridium (Ir)-based complex compound having a benzothiophene-pyridine ligand represented by <Formula 4> below.

<Formula 4>

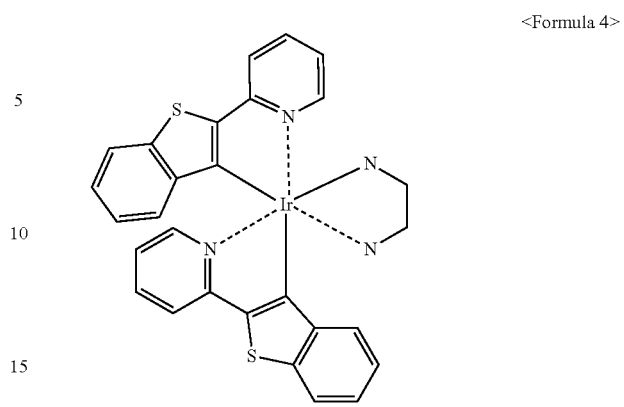

In this case, out of the ligands bonded to the iridium, the ligand of N—N may represent an auxiliary ligand.

For another example, the linker 120 may be an iridium-based complex compound having a phenyl-pyridine ligand. Specifically, for example, the linker 120 may be at least one of an iridium-based complex compound having a 2-phenyl-pyridine ligand represented by <Formula 5> below, an iridium complex compound having a 2-(2,4-difluoro-phenyl)-pyridine ligand represented by <Formula 6> below, an iridium complex compound having a 2-(4-methoxy-phenyl)-5-methyl-pyridine ligand represented by <Formula 7> below, an iridium complex compound having a 2-(4-fluoro-phenyl)-5-methyl-pyridine ligand represented by <Formula 8>, an iridium complex compound having a 2,6-difluoro-3-(4-methyl-pyridin-2-yl)-benzonitrile ligand represented by <Formula 9> below, or an iridium complex compound having a 2-(2,4-difluoro-phenyl)-5-trifluoromethyl-pyridine ligand represented by <Formula 10> below.

<Formula 5>

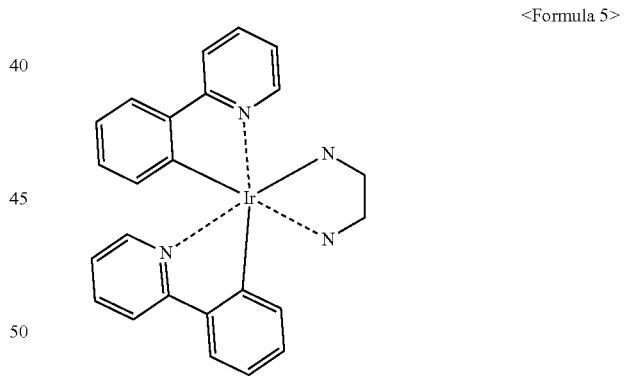

<Formula 6>

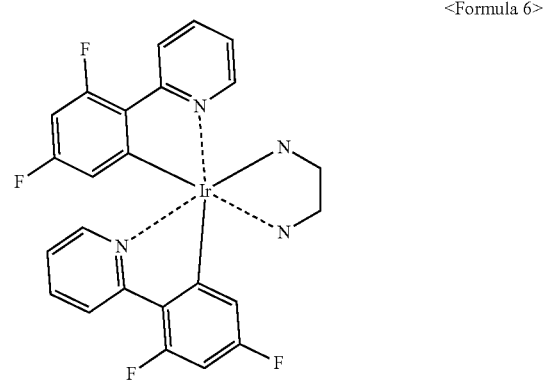

-continued

<Formula 7>
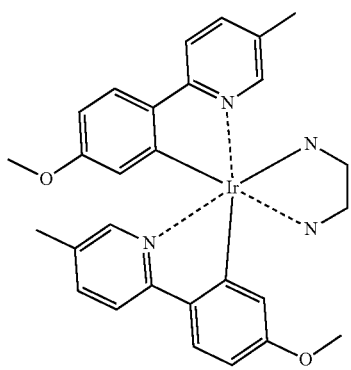

<Formula 8>
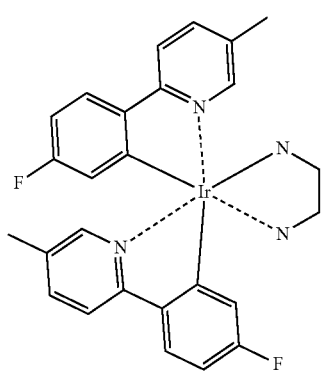

<Formula 9>
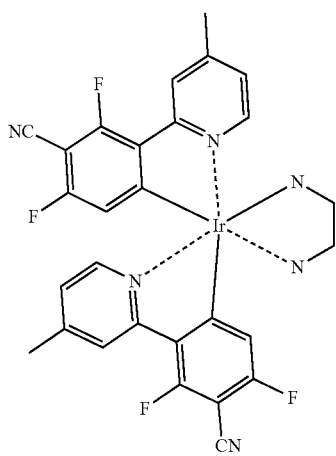

<Formula 10>
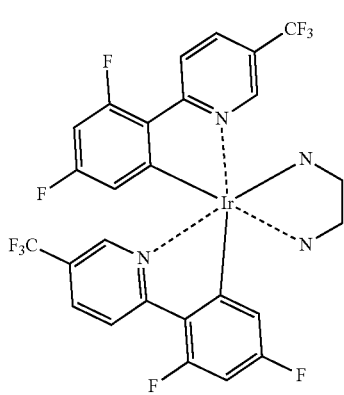

For another example, the linker 120 may be a rhenium-based complex compound having a bipyridine ligand. Specifically, for example, the linker 120 may be at least one of a rhenium complex compound having a [2,2'] bipyridyl ligand represented by <Formula 11> below, a rhenium complex compound having a 5,5'-dimethyl-[2,2']bipyridyl ligand represented by <Formula 12> below, a rhenium complex compound having a 5,5'-difluoro-[2,2']bipyridyl ligand represented by <Formula 13> below, a rhenium complex compound having a 5,5'-dimethoxy-[2,2']bipyridyl ligand represented by <Formula 14> below, a rhenium complex compound having a 4,4'-di-tert-butyl-[2,2']bipyridyl ligand represented by <Formula 15> below, or a rhenium complex compound having a 4,4'-diamino-[2,2'] bipyridyl ligand represented by <Formula 16> below.

<Formula 11>
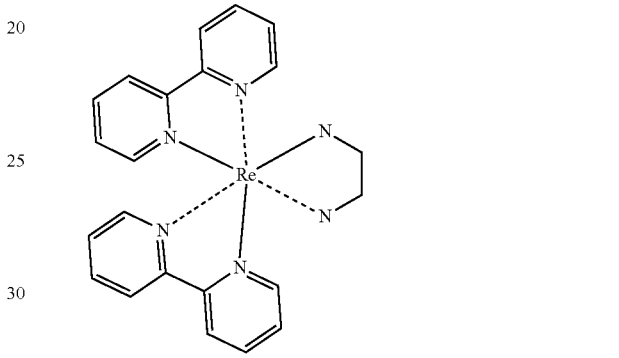

<Formula 12>
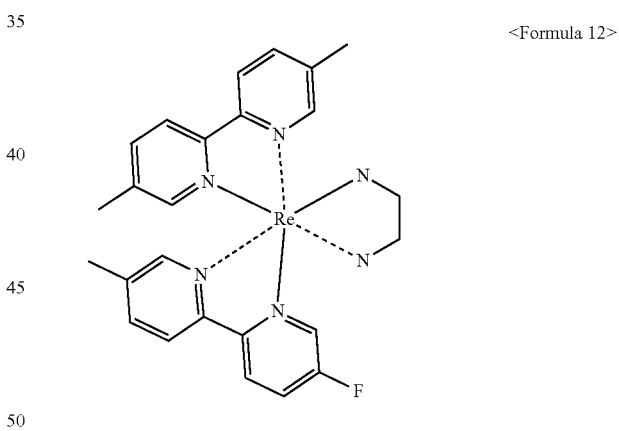

<Formula 13>
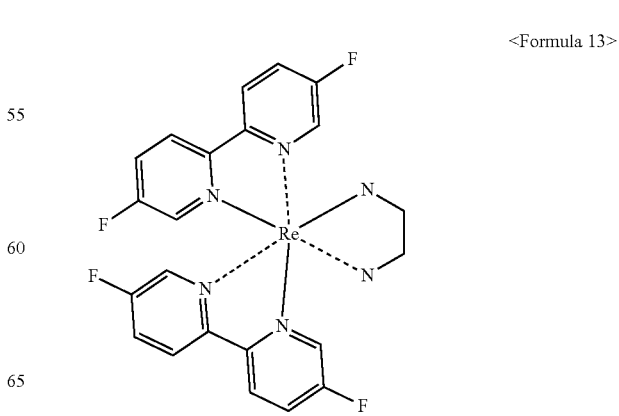

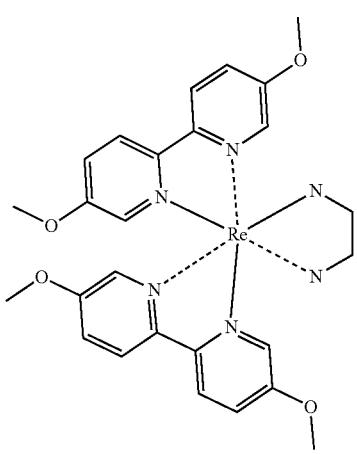
<Formula 14>

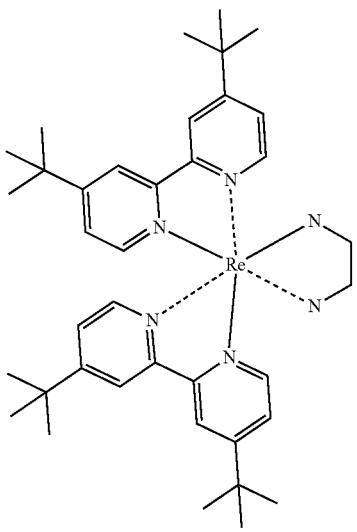
<Formula 15>

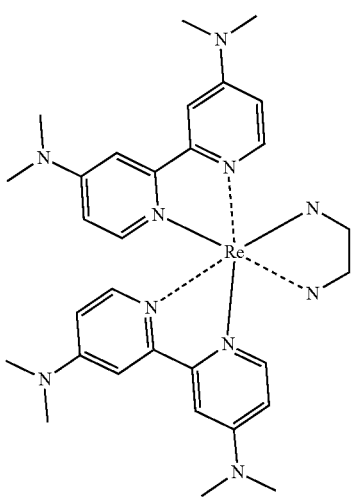
<Formula 16>

Referring to FIGS. 1 and 2, the organic-inorganic porous body 100 may be dispersed in a solution containing a molecular reduction catalyst 130, so as to prepare a composite catalyst according to a first embodiment, in which the organic-inorganic porous body 100 and the molecular reduction catalyst 130 are bonded (S120).

According to one embodiment, the molecular reduction catalyst 130 may be a carbon dioxide reduction catalyst, and the molecular reduction catalyst 130 may be a metal complex compound having at least one metal element out of rhenium (Re), rubidium (Ru), manganese (Mn), cobalt (Co), nickel (Ni), iron (Fe), or iridium (Ir). In addition, the molecular reduction catalyst 130 may include at least one functional group out of a carboxyl group (COOH), a phosphate group ($PO_3H_2$), or a CNCOON group, and thus the molecular reduction catalyst 130 may be easily bonded with the organic-inorganic porous body 100.

For example, the molecular reduction catalyst 130 may include a carboxyl group as a functional group, and may be a rhenium complex compound represented by <Formula 17> below.

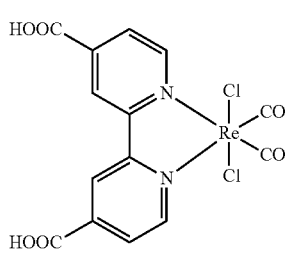
<Formula 17>

For another example, the molecular reduction catalyst 130 may include a carboxyl group as a functional group, and may be at least one of a rubidium complex compound represented by <Formula 18> below or a manganese complex compound represented by <Formula 19> below.

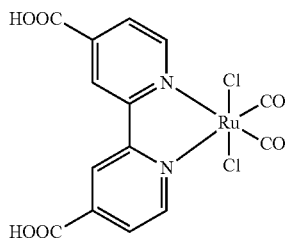
<Formula 18>

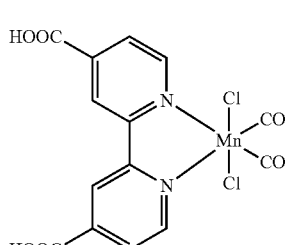
<Formula 19>

For another example, the molecular reduction catalyst 130 may include a bipyridine ligand, but the molecular reduction catalyst 130 may also include two of the bipyridine ligands and may be a rubidium complex compound represented by <Formula 20> below, or the molecular reduction catalyst 130 may include one of the bipyridine ligands and may be at least one of a rhenium complex compound represented by <Formula 21> below, a rubidium complex compound represented by <Formula 22> below, or a manganese complex compound represented by <Formula 23> below.

<Formula 20>

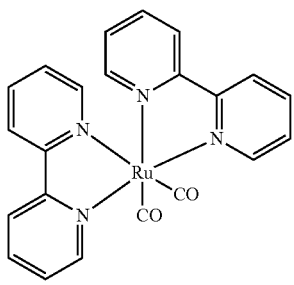

<Formula 21>

<Formula 22>

<Formula 23>

For another example, the molecular reduction catalyst 130 may include a terphenyl ligand, and may be at least one of an iridium complex compound represented by <Formula 24> below or a cobalt complex compound represented by <Formula 25> below.

<Formula 24>

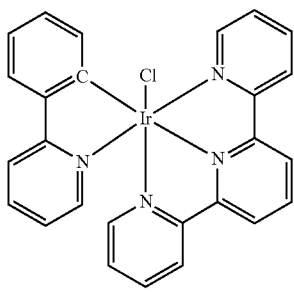

<Formula 25>

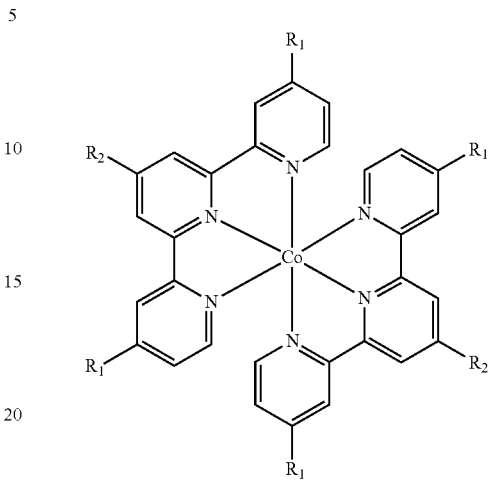

For another example, the molecular reduction catalyst 130 may include a phenanthrene ligand, and may be at least one of an iron complex compound represented by <Formula 26> below or a <Formula 27> below.

<Formula 26>

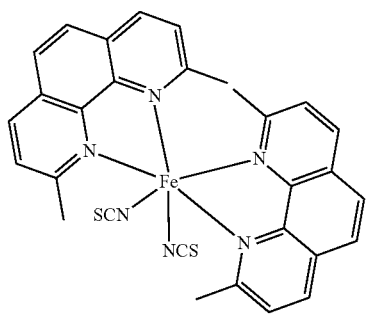

<Formula 27>

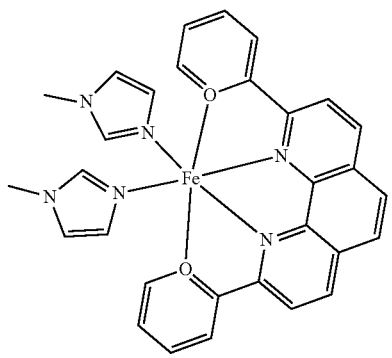

For another example, the molecular reduction catalyst 130 may include a cyclic ligand, and may be at least one of an iron compound represented by <Formula 28> below, a cobalt compound represented by <Formula 29> below, and a nickel complex compound represented by <Formula 30> or <Chemical Formula 31> below.

<Formula 28>

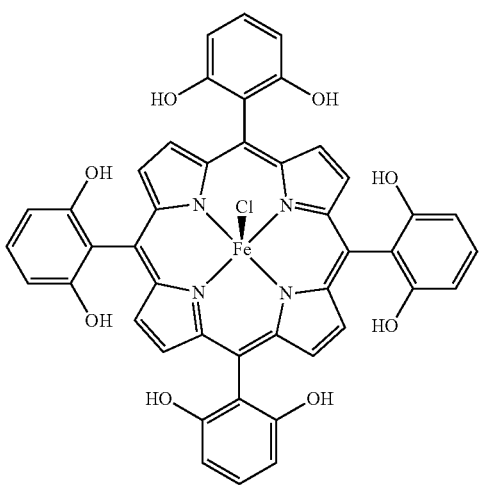

<Formula 29>

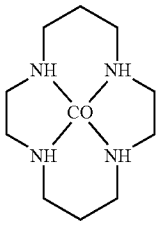

<Formula 30>

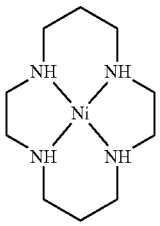

<Formula 31>

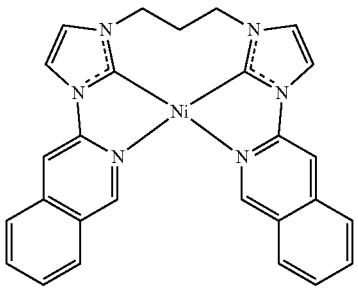

Specifically, for example, the molecular reduction catalyst 130 may be a rhenium complex compound represented by above <Formula 17> and including a carboxyl group as a functional group, and the organic-inorganic porous body 100 may include a zirconium oxide as the metal oxide cluster 110, and include zinc-porphyrin represented by above <Formula 1> as the linker 120. In this case, the organic-inorganic porous body 100 may be dispersed in an ethanol solution containing the molecular reduction catalyst 130, and thus the functional group of the molecular reduction catalyst 130 may be bonded with the metal oxide cluster 110 as shown in FIG. 2, so as to prepare a composite catalyst according to a first embodiment.

In addition, for example, the molecular reduction catalyst 130 may be mixed in a range of 0.01% or more compared to the organic-inorganic porous body 100. Unlike the above, if the molecular reduction catalyst 130 is mixed in a range of less than 0.01%, the amount of the molecular reduction catalyst 130 capable of receiving the electrons produced from the exciton may be small. Accordingly, some of the excitons may not provide the electrons to the molecular reduction catalyst 130, and thus may lose energy to have a ground state. In other words, substantially all of the electrons usable for the reduction of carbon dioxide may not be consumed in the molecular reduction catalyst 130. Accordingly, the catalytic properties of the composite catalyst according to the first embodiment may be deteriorated.

As described above, however, when being mixed in a range of 0.01% or more compared to the organic-inorganic porous body 100, the molecular reduction catalyst 130 may receive substantially all of the electrons transferred from the exciton. Accordingly, the catalytic activity of the composite catalyst according to the first embodiment can be easily increased.

The composite catalyst according to the first embodiment prepared as described above may include the organic-inorganic porous body 100 including the linker 120, and the molecular reduction catalyst 130 bonded to the organic-inorganic porous body 100. In this case, as described above, the linker 120 may absorb light in the visible light region to form an exciton, and the exciton may be moved through energy transfer between the linkers 120. In this case, the linker 120 may transfer an electron of the exciton to the molecular reduction catalyst 130. Thus, the molecular reduction catalyst 130 can provide the electron to carbon dioxide so as to easily reduce the carbon dioxide.

Referring to FIG. 3, light energy may be irradiated to the composite catalyst according to the first embodiment described above with reference to FIGS. 1 and 2. Accordingly, the linker 120 may absorb the light energy, and thus an exciton may be formed in the linker 120. The exciton may have a first excited state (Si) or a second excited state (Sn, where n is an integer of 2 or more) having energy higher than the first excited state. The exciton having the second excited state may release some energy to have the first excited state through an intramolecular electron transfer. Accordingly, substantially most of the excitons may have the first excited state. The first excited state may consist of a plurality of levels.

Specifically, for example, if the linker 120 is zinc-porphyrin, the first level ($E_{ox,1}^*$) having the lowest energy out of the levels of the first excited state may have an energy corresponding to 655 nm, and the second level ($E_{ox,2}^*$) having the second lowest energy may have an energy corresponding to 615 nm. In this case, if the molecular reduction catalyst 130 is a rhenium complex compound represented by above <Formula 15>, a reduction potential of the rhenium complex compound may be −0.94 eV. The reduction level may correspond to 615 nm of the zinc-porphyrin. In other words, the reduction level may correspond to the second level ($E_{ox,2}^*$) of the zinc-porphyrin, and thus the exciton having the second level ($E_{ox,2}^*$) may move along the linker 120. In this case, a time for which the exciton stays in one of the linkers 120 may be about 50 ps. Thus, the exciton can very quickly move along the linker 120.

As described above with reference to FIGS. 1 and 2, the exciton may provide an electron of the exciton into the molecular reduction catalyst 130. In general, the exciton may be defined as a pair of electron and hole. Thus, the exciton may provide the electron into the molecular reduction catalyst 130 and may be decomposed. At the same time, the exciton may lose its energy. In other words, the exciton may be quenched.

FIG. 4 is a flowchart for explaining a method for preparing a composite catalyst for carbon dioxide reduction according to a second embodiment of the present invention, FIG. 5 is a structural formula showing a composite catalyst for carbon dioxide reduction according to a second embodiment of the present invention, and FIG. 6 is an energy band diagram showing a moving path of light energy irradiated onto a composite catalyst for carbon dioxide reduction according to a second embodiment of the present invention.

Referring to FIG. 4, the method for preparing a composite catalyst for carbon dioxide reduction according to the second embodiment of the present invention may be performed as described above in the method for preparing the composite catalyst for carbon dioxide reduction according to the first embodiment with reference to FIGS. 1 to 3, but the coating of the surface of the organic-inorganic porous body 100 with a ceramic shell 125 may be further included after the providing of the organic-inorganic porous body 100.

In other words, the providing of the organic-inorganic porous body 100 according to the second embodiment of the present invention (S210) may correspond to the providing of the organic-inorganic porous body 100 according to the first embodiment of the present invention (S110).

Referring to FIGS. 4 and 5, the ceramic shell 125 may be coated on the surface of the organic-inorganic porous body 100 (S220).

According to one embodiment, the ceramic shell 125 may include at least one of metal oxide or metal sulfide.

For example, the metal oxide may include at least one of titanium oxide, zinc oxide, tin oxide, aluminum oxide, iron oxide, zirconium oxide, or hafnium oxide.

For another example, the metal sulfide may include at least one of zinc sulfide, cadmium sulfide, or tin sulfide.

According to one embodiment, the ceramic shell 125 may be coated on the surface of the organic-inorganic porous body 100 by performing an atomic layer deposition method.

Specifically, the preparing of the ceramic shell 125 may include charging the organic-inorganic porous body 100 into a chamber, providing a metal precursor into the chamber, purging the metal precursor remaining in the chamber, providing an oxygen precursor into the chamber, and purging a residue in the chamber. In this case, the metal precursor may have a higher binding force with the metal oxide cluster 110 compared to the linker 120, and thus the ceramic shell 125 may be formed mainly on the surface of the metal oxide cluster 110.

The providing of the metal precursor may include providing the metal precursor into the chamber to adsorb the metal precursor onto the surface of the organic-inorganic porous body 100. For example, the metal precursor may be at least one of titanium isopropoxide (TTIP) represented by <Formula 32> below, titanium tetrafluoride ($TiF_4$), or titanium tetrachloride ($TiCl_4$).

<Formula 32>

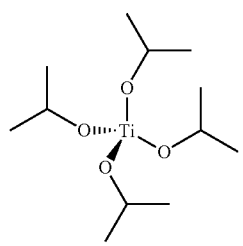

The purging of the metal precursor may include purging the metal precursor remaining in the chamber without being adsorbed onto the surface of the organic-inorganic porous body 110 by using an inert gas. For example, the inert gas may include at least one of argon gas or nitrogen gas.

The providing of the oxygen precursor may include providing the oxygen precursor into the chamber to react with the metal precursor adsorbed onto the surface of the organic-inorganic porous body 110. For example, the oxygen precursor may be at least one of water (that is, vapor) or oxygen gas.

The purging of the residue may include purging the impurities formed in the chamber by the above-described reaction and the oxygen precursor remaining in the chamber by using the inert gas.

In this case, the providing of the metal precursor, the purging of the metal precursor, the providing of the oxygen precursor, and the purging of the residue may be defined as one unit process. The ceramic shell 125 may be formed on the surface of the organic-inorganic porous body 100 by repeating the unit process.

For example, the unit process may be performed in a range of more than 30 to less than 70 times, and specifically, for example, the unit process may be performed 50 times. Unlike the above, if the unit process is performed less than 50 times or more than 50 times, the composite catalyst including the coated organic-inorganic porous body 100 according to the second embodiment described below may have a comparatively low rate of carbon dioxide reduction. In other words, the amount of carbon monoxide produced due to the reduction of carbon dioxide may be relatively low.

As described, however, if the unit process is repeated 50 times, the composite catalyst according to the second embodiment described below may exhibit a relatively high amount of produced carbon monoxide.

The coated organic-inorganic porous body 100 may be dispersed in a solution containing a molecular reduction catalyst 130, so as to prepare a composite catalyst according to the second embodiment, in which the coated organic-inorganic porous body 100 and the molecular reduction catalyst 130 are bonded (S230).

The molecular reduction catalyst 130 may be provided as described above with reference to FIGS. 1 and 2, and the preparing of a composite catalyst to which the molecular reduction catalyst 130 is bonded may be also performed as described above with reference to FIGS. 1 and 2.

Accordingly, specifically, for example, the coated organic-inorganic porous body 100 may be provided into an ethanol solution containing the molecular reduction catalyst 130 so as to prepare a mixed solution. The mixed solution may be stirred for four hours, and thus the composite catalyst according to the second embodiment may be prepared.

In this case, unlike the above with reference to FIGS. 1 and 2, the composite catalyst according to the second embodiment may further include the ceramic shell 125 coated on the surface of the organic-inorganic porous body 100. Thus, as shown in FIG. 5, the molecular reduction catalyst 130 may be bonded onto the surface of the metal oxide cluster 110 coated with the ceramic shell 125.

In other words, as shown in FIG. 5, the composite catalyst according to the second embodiment prepared as described above may include the organic-inorganic porous body 100 including the metal oxide cluster 110 connected by the linker 120, the ceramic shell 125 coated on the surface of the organic-inorganic porous body 100, and the molecular reduction catalyst 130 bonded to the coated organic-inorganic porous body 100.

As described above, the composite catalyst according to the second embodiment of the present invention may further include the ceramic shell 125 surrounding the organic-inorganic porous body 100 of the composite catalyst according to the first embodiment.

Accordingly, as described above with reference to FIGS. 1 and 3, the linker 120 may absorb light in the visible light region irradiated from the outside to form the exciton, and the electron of the exciton may move to the molecular reduction catalyst 130 through the metal oxide cluster 110 coated with the ceramic shell 125.

In other words, unlike the metal oxide cluster 110 in the composite catalyst according to the first embodiment, which serves as a structure for connecting the linker 120, the metal oxide cluster 110 in the composite catalyst according to the second embodiment may have a surface coated with the ceramic shell 125, and may serve to transfer the electron of the exciton.

Specifically, referring to FIG. 6, light energy in the visible region may be irradiated into the composite catalyst according to the second embodiment as described above with reference to FIGS. 4 and 5. The linker 125 may absorb the light energy to form an electron in the linker 125. The electron may have a first excited state ($S_1$) or a second excited state ($S_n$, where n is an integer of 2 or more) having energy higher than the first excited state. The electron having the second excited state may release some of the energy thereof, so as to have the first excited state through an intramolecular electron transfer. Accordingly, substantially most of the electrons may have the first excited state.

The electron having the first excited state may move to a conduction band of the ceramic shell 125 or a trap level ($S_{trap}$) formed in the linker 125. In this case, the electron may move faster to the conduction band than to the trap level, and thus the electron may easily move to the metal oxide cluster 120 coated with the ceramic shell 125.

Accordingly, as described above with reference to FIGS. 4 and 5, the electron produced by the linker 120 may be easily provided to the molecular reduction catalyst through the metal oxide cluster 110 coated with the ceramic shell 125.

Specifically, for example, a rate ($k_2$) at which the electron moves from the first excited state to the trap level may be 30 to 40 ps, and a rate ($k_1$) at which the electron moves from the first excited state to the conduction band may be 5 ps.

FIG. 7 is a view showing a moving path of light energy irradiated onto a catalytic composition for carbon dioxide reduction including the composite catalyst according to the first embodiment of the present invention.

Referring to FIG. 7, a catalytic composition for carbon dioxide reduction including a composite catalyst according to the first embodiment described above with reference to FIGS. 1 to 3 and a sacrificial electron donor may be prepared, or a catalytic composition for carbon dioxide reduction including a composite catalyst according to the second embodiment described above with reference to FIGS. 4 to 6 and the sacrificial electron donor may be prepared.

According to one embodiment, the sacrificial electron donor may be at least one of 1,3-dimethyl-2-phenyl-1,3-dihydrobenzimidazole (BIH) represented by <Formula 33> below, or triethanolamine (TEOA) represented by <Formula 34>.

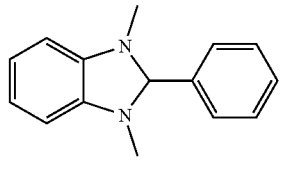

<Formula 33>

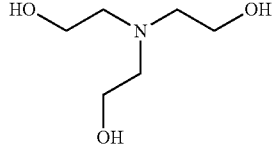

<Formula 34>

The catalytic composition may further include an additive. Specifically, for example, the additive may be Bronsted acid. For example, the additive may be at least one of water or 2,2,2-trifluoroethanol (TFE) represented by <Formula 35> below.

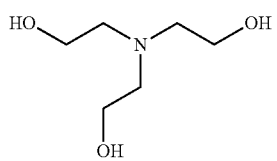

<Formula 35>

As described in FIGS. 1 to 6, the composite catalyst according to the first embodiment or the composite catalyst according to the second embodiment may receive light energy irradiated from the outside to provide an electron to the molecular reduction catalyst 130 and the molecular reduction catalyst 130 may provide the electron to the carbon dioxide. Accordingly, the molecular reduction catalyst 130 may reduce the carbon dioxide.

In this case, the sacrificial electron donor may provide an electron of the exciton and may provide the electron to the linker 120 which has lost an electron. At the same time, the balance of electron and hole may be maintained relatively quickly in the linker 120. Accordingly, some of the linkers 120, which have received the electrons from the sacrificial electron donors, may absorb light energy again and form excitons at the same time. In other words, the sacrificial electron donors can easily increase the amount of electrons transferred to the molecular reduction catalyst 130.

Specifically, according to the first embodiment of the present invention, the composite catalyst may include the metal oxide cluster 110 and the linker 120 between the metal oxide clusters 110 as described above with reference to FIGS. 1 to 3. In other words, the linker 120 may be connected to the metal oxide cluster 110 between the linkers 120.

Unlike the above, the linker 120 may not be connected to the metal oxide cluster 110. In other words, if the linkers 120 are not arranged at regular intervals, the excitons may not easily move between the linkers 120. That is to say, as described above with reference to FIG. 1, Forster energy transfer or Dexter energy transfer of the exciton may not be easily performed. In general, the Foster energy transfer may be easily performed when a distance between molecules is 100 Å or less, and the Dexter energy transfer may be easily performed at an inter-molecular distance of 10 Å or less, which is shorter than the Foster energy transfer. Thus, if the linker 120 is not connected to the metal oxide cluster 110, a distance between the linkers 120 may increase, and thus the exciton may not easily move through energy transfer between the linkers 120, so as to lower catalytic ability for the carbon dioxide reduction of the catalytic composition.

However, as described above, if the linker 120 is connected to the metal oxide cluster 110, the linker 120 may be arranged apart by the particle size of the metal oxide cluster 110. Accordingly, the exciton produced from the linker 120 can easily move along the linker 120.

In addition, according to the second embodiment of the present invention, the composite catalyst may include the ceramic shell 125 surrounding the surface of the metal oxide cluster 110 as described above with reference to FIGS. 4 to 6. Accordingly, the electron of the exciton formed by the linker 120 may move to the coated metal oxide cluster 110 by receiving light energy from the visible light region.

Specifically, for example, as described above with reference to FIG. 3, a time for which the exciton stays in one of the linkers 120 during the energy transfer between the linkers 120 may be 50 ps. In contrast, as described above with reference to FIG. 6, a time required for the electron of the exciton to move from the linker 120 to the coated metal oxide cluster 110 may be 5 ps. In other words, in the composite catalyst according to the second embodiment of the present invention, it may be easier to transfer the electron of the exciton to the coated metal oxide cluster 110 than to move along the linker 120.

As described above, the catalytic composition including the composite catalyst according to the first embodiment or the composite catalyst according to the second embodiment may transfer the electron of the exciton formed by the linker 120 to the carbon dioxide through the molecular reduction catalyst 130. Accordingly, the catalytic composition may reduce the carbon dioxide to generate carbon monoxide.

Hereinafter, the method for preparing a composite catalyst for carbon dioxide reduction according to a specific experimental example of the present invention and the results of evaluating properties will be described.

Preparing of Composite Catalyst for Carbon Dioxide Reduction According to Comparative Example 1 and Experimental Example 1-1 to 1-6

PCN-222(Zn) was provided as an organic-inorganic porous body, and (L)Re$^I$(CO)$_3$Cl (where L is 4,4'-dicarboxylic-2,2'-bipyridine) was provided as a molecular reduction catalyst.

PCN-222(Zn) was provided into an ethanol solution containing (L)Re$^I$(CO)$_3$Cl, so as to prepare a composite catalyst for carbon dioxide reduction in which PCN-222(Zn) and (L)Re$^I$(CO)$_3$Cl are bonded.

In this case, in the composite catalyst for carbon dioxide reduction according to Comparative Example 1 and Experimental Examples 1-1 to 1-6, a concentration of the molecular reduction catalyst compared to the organic-inorganic porous body is as shown in <Table 1> below.

TABLE 1

| | Concentration of molecular reduction catalyst (%) |
|---|---|
| Comparative Example 1 | 0 |
| Experimental Example 1-1 | 0.00013 |
| Experimental Example 1-2 | 0.00059 |
| Experimental Example 1-3 | 0.0059 |

TABLE 1-continued

| | Concentration of molecular reduction catalyst (%) |
|---|---|
| Experimental Example 1-4 | 0.013 |
| Experimental Example 1-5 | 0.026 |
| Experimental Example 1-6 | 0.059 |

Preparing of Coated Organic-Inorganic Porous Body According to Experimental Example 2-1-1

Titanium isopropoxide (TTIP) was provided as the metal precursor, and water was provided as the oxygen precursor.

The coated organic-inorganic porous body according to Comparative Example 1 was charged into a chamber.

A coated organic-inorganic porous body according to Experimental Example 2-1-1 was prepared by repeating the unit process of "metal precursor injection→purge gas injection→oxygen precursor injection→purge gas injection" five times.

Preparing of Coated Organic-Inorganic Porous Body According to Experimental Example 2-1-2

A coated organic-inorganic porous body according to Experimental Example 2-1-2 was prepared by the same method as described above in the coated organic-inorganic porous body according to Experimental Example 2-1-1, except for repeating the unit process 10 times instead of 5 times.

Preparing of Coated Organic-Inorganic Porous Body According to Experimental Example 2-1-3

A coated organic-inorganic porous body according to Experimental Example 2-1-3 was prepared by the same method as described above in the coated organic-inorganic porous body according to Experimental Example 2-1-1, except for repeating the unit process 20 times instead of 5 times.

Preparing of Coated Organic-Inorganic Porous Body According to Experimental Example 2-1-4

A coated organic-inorganic porous body according to Experimental Example 2-1-4 was prepared by the same method as described above in the coated organic-inorganic porous body according to Experimental Example 2-1-1, except for repeating the unit process 30 times instead of 5 times.

Preparing of Coated Organic-Inorganic Porous Body According to Experimental Example 2-1-5

A coated organic-inorganic porous body according to Experimental Example 2-1-5 was prepared by the same method as described above in the coated organic-inorganic porous body according to Experimental Example 2-1-1, except for repeating the unit process 50 times instead of 5 times.

A coating process for the coated organic-inorganic porous body according to Comparative Example 1 and Experimental Examples 2-1-2 to 2-1-5 and the number of repeating the unit process are as shown in <Table 2> below.

TABLE 2

|  | Coating process | Number of repeating coating process |
|---|---|---|
| Comparative Example 1 | — | — |
| Experimental Example 2-1-1 | ALD | 5 |
| Experimental Example 2-1-2 | ALD | 10 |
| Experimental Example 2-1-3 | ALD | 20 |
| Experimental Example 2-1-4 | ALD | 30 |
| Experimental Example 2-1-5 | ALD | 50 |

Preparing of Composite Catalyst for Carbon Dioxide Reduction According to Experimental Example 2-2-1

A composite catalyst for carbon dioxide reduction according to Experimental Example 2-2-1 was prepared by the same method as described above in the composite catalyst for carbon dioxide reduction according to Experimental Example 1-3, except for using the coated organic-inorganic porous body according to Experimental Example 2-1-1 instead of the coated organic-inorganic porous body according to above Comparative Example 1.

Preparing of Composite Catalyst for Carbon Dioxide Reduction According to Experimental Example 2-2-2

A composite catalyst for carbon dioxide reduction according to Experimental Example 2-2-2 was prepared by the same method as described above in the composite catalyst for carbon dioxide reduction according to Experimental Example 1-3, except for using the coated organic-inorganic porous body according to Experimental Example 2-1-2 instead of the coated organic-inorganic porous body according to above Comparative Example 1.

Preparing of Composite Catalyst for Carbon Dioxide Reduction According to Experimental Example 2-2-3

A composite catalyst for carbon dioxide reduction according to Experimental Example 2-2-3 was prepared by the same method as described above in the composite catalyst for carbon dioxide reduction according to Experimental Example 1-3, except for using the coated organic-inorganic porous body according to Experimental Example 2-1-3 instead of the coated organic-inorganic porous body according to above Comparative Example 1.

Preparing of Composite Catalyst for Carbon Dioxide Reduction According to Experimental Example 2-2-4

A composite catalyst for carbon dioxide reduction according to Experimental Example 2-2-4 was prepared by the same method as described above in the composite catalyst for carbon dioxide reduction according to Experimental Example 1-3, except for using the coated organic-inorganic porous body according to Experimental Example 2-1-4 instead of the coated organic-inorganic porous body according to above Comparative Example 1.

Preparing of Composite Catalyst for Carbon Dioxide Reduction According to Experimental Example 2-2-5

A composite catalyst for carbon dioxide reduction according to Experimental Example 2-2-5 was prepared by the same method as described above in the composite catalyst for carbon dioxide reduction according to Experimental Example 1-3, except for using the coated organic-inorganic porous body according to Experimental Example 2-1-5 instead of the coated organic-inorganic porous body according to above Comparative Example 1.

FIG. 8 is a view showing a steady-state luminescence spectrum depending on a concentration of a molecular reduction catalyst of a composite catalyst according to an embodiment of the present invention.

Referring to FIG. 8, luminescence properties of the composite catalyst for carbon dioxide reduction according to Comparative Example 1 and Experimental Examples 1-1 to 1-6 of the present invention were confirmed, in which a concentration of a molecular reduction catalyst bonded with the organic-inorganic porous body including the zirconium oxide cluster ($Zr_6O_8$) as the metal oxide cluster and zinc-porphyrin as the linker is in the range of 0 to 0.059%.

As shown in FIG. 8, it can be understood that the composite catalyst according to the first embodiment exhibits a luminescence peak at 615 nm and 655 nm. Accordingly, with regard to an excited state ($S_1$, that is, Q-band) of the molecular reduction catalyst described above with reference to FIG. 3, it can be understood that a first level with the lowest energy is 655 nm and a second level with the second lowest energy is 615 nm. In this case, it can be understood that an intensity of the first level decreases as a concentration of the molecular reduction catalyst increases.

FIG. 9 is a view showing a time-resolved photoluminescence (TRPL) spectrum depending on a concentration of a molecular reduction catalyst of a composite catalyst for carbon dioxide reduction according to an embodiment of the present invention.

Referring to FIG. 9, it can be understood as described above with reference to FIG. 8 that an intensity of the first level of the molecular reduction catalyst decreases as a concentration of the molecular reduction catalyst increases. Accordingly, a time-resolved photoluminescence spectrum for an energy of the first level is shown according to the concentration of the molecular reduction catalyst.

As shown in FIG. 9, it can be understood that the composite catalyst for carbon dioxide reduction according to Comparative Example 1 and Experimental Examples 1-1 to 1-6 of the present invention follows a multi-exponential functional decay function represented by <Equation 1> below.

$$y = \Sigma A_n \times e^{-k\tau_n} \qquad \text{<Equation 1>}$$

In this case, $\tau_n$ represents a phosphorescence lifetime component, and n is an integer of 1 or more. The coefficients ($A_1$, $A_2$ and $A_3$) and indices ($\tau_1$, $\tau_2$ and $\tau_3$) of the time-resolved photoluminescence spectrum calculated according to above <Equation 1> are as shown in <Table 3> below.

TABLE 3

|  | $A_1$(%) | $\tau_1$(ns) | $A_2$(%) | $\tau_2$(ns) | $A_3$(%) | $\tau_3$(ns) | $\tau_{avg}$(ns) |
|---|---|---|---|---|---|---|---|
| Comparative Example 1 | 82.8 | 1.58 (0.18) | 17.2 | 4.65 (1.39) | — | — | 2.10 |
| Experimental Example 1-1 | 56.5 | 0.88 (0.16) | 43.5 | 3.20 (0.30) | — | — | 1.89 |
| Experimental Example 1-2 | 39.8 | 0.52 (0.11) | 60.2 | 2.44 (0.12) | — | — | 1.68 |
| Experimental Example 1-3 | 59.6 | 0.30 (0.04) | 40.4 | 2.33 (0.11) | — | — | 1.12 |
| Experimental Example 1-4 | 62.1 | 0.14 (0.03) | 31.6 | 1.50 (0.22) | 6.3 | 4.5 (2.0) | 0.85 |

TABLE 3-continued

| | $A_1$(%) | $\tau_1$(ns) | $A_2$(%) | $\tau_2$(ns) | $A_3$(%) | $\tau_3$(ns) | $\tau_{avg}$(ns) |
|---|---|---|---|---|---|---|---|
| Experimental Example 1-5 | 72.0 | 0.18 (0.02) | 26.9 | 1.98 (0.18) | 1.0 | 4.7 (3.0) | 0.77 |
| Experimental Example 1-6 | 57.6 | 0.15 (0.03) | 26.0 | 0.91 (0.22) | 16.3 | 2.9 (3.2) | 0.80 |

As described above, an average photoluminescence lifetime ($\tau_{avg}$) of the composite catalyst according to the first embodiment was calculated according to <Equation 2> below by using the coefficients and indices as shown in <Table 3>.

$$\tau_{avg} = \frac{\sum A_n \times \tau_n}{\sum A_n}. \qquad \text{<Equation 2>}$$

As can be understood from <Table 3>, in the composite catalyst according to the first embodiment, it can be seen that a change of the lifetime component decreases in the range that a concentration of the molecular reduction catalyst is 0.013 to 0.059%. In other words, if the concentration of the molecular reduction catalyst is 0.013% or more, it can be understood that the catalytic properties of the composite catalyst according to the first embodiment are enhanced.

FIG. 10 is a view showing a Stern-Volmer plot depending on a concentration of a molecular reduction catalyst of a composite catalyst according to an embodiment of the present invention.

Referring to FIG. 10, as described above with reference to FIGS. 3 and 7, the exciton may provide an electron to the molecular reduction catalyst, and thus the exciton may lose energy to be quenched. Accordingly, in order to confirm the quenching phenomenon of the exciton, the Stern-Volmer relationship represented by Equation 3 below was used.

$$\frac{I_0}{I} = \frac{\tau_0}{\tau} = (1 + K[Q])e^{V[Q]} \qquad \text{<Equation 3>}$$

In this case, K is a dynamic quenching constant, and V is a static quenching constant. In general, the static quenching constant may represent an active volume around a chromophore (that is, a position at which the exciton releases its energy in the linker), and thus the exciton may release energy to be quenched, if the exciton is present in the active volume.

As described above with reference to FIGS. 1 and 2, the molecular reduction catalyst may be bonded with the organic-inorganic porous body. However, the molecular reduction catalyst may be randomly (that is, without a regular arrangement) bonded with the organic-inorganic porous body. Alternatively, some of the molecular reduction catalysts may form an incomplete bond with the organic-inorganic porous body. Thus, it may not be easy for substantially all of the molecular reduction catalysts of the composite catalyst according to the first embodiment to receive electrons of the excitons. In other words, it may not be easy for the molecular reduction catalyst which forms an incomplete bond with the organic-inorganic porous body to receive an electron from the exciton and to provide a quenching site of the exciton. Accordingly, considering a quenching site which is not practically accessible by the exciton, the Stern-Volmer relationship represented by above <Equation 3> may be calculated as shown in <Equation 4> below.

$$\frac{\tau}{\tau_0} = \sum_{i=1}^n \frac{f_i}{(1 + K_i[Q])e^{V_i[Q]}} \qquad \text{<Equation 4>}$$

In this case, f represents a ratio of the quenching site and i represents the chromophore. As described above, <Equation 5> below was assumed in order to exclude a quenching site which is not practically accessible by the exciton.

$$K_1 = V_1 = 0 \qquad \text{<Equation 5>}$$

Thus, the Stern-Volmer relationship may be expressed as <Equation 6> below by substituting above <Equation 5> for above <Equation 4>.

$$\frac{\tau}{\tau_0} = f_1 + \frac{f_2}{(1 + K_2[Q])e^{V_2[Q]}} \qquad \text{<Equation 6>}$$

In this case, the $f_1$ represents a fraction of the quenching site which is not accessible by the exciton, and $f_2$ represents a fraction of the quenching site which is accessible by the exciton.

Accordingly, the Stern-Volmer constant of the composite catalyst according to the first embodiment, which is calculated by using the ratio of the luminescence intensity ($I/I_0$) of the steady-state luminescence spectrum shown in FIG. 8 and the concentration ([Q]) of the composite catalyst according to the first embodiment described in <Table 1> are as shown in <Table 4> below.

TABLE 4

| | S-V constant |
|---|---|
| $f_1$ | 0.37 |
| $f_2$ | 0.63 |
| $K_2$ | 159 |
| $V_2$ | 133 |

As described above in <Table 4>, it was confirmed for the molecular reduction catalyst that covering about 63% of the surface of the organic-inorganic porous body facilitates the electron transfer of the exciton.

In addition, as described above with reference to FIG. 9, it can be understood that the Stern-Volmer relationship becomes substantially constant when the concentration of the molecular reduction catalyst is 0.013% or more.

FIG. 11 is a view showing an absorbance of a coated organic-inorganic porous body according to an embodiment of the present invention.

Referring to FIG. 11, a reflectance of incident light was measured in the coated organic-inorganic porous body according to Comparative Example 1 and Experimental Examples 2-1-2 to 2-1-5 of the present invention.

As shown in FIG. 11, it can be understood that the absorbance peak of the coated organic-inorganic porous body relatively moves to a longer wavelength, as the number of repeating the coating process increases.

In addition, it was confirmed that the absorbance of the coated organic-inorganic porous body decreases, as the number of repeating the coating process increases.

Accordingly, it can be understood that the reflectance of the coated organic-inorganic porous body according to Experimental Example 2-1-5 is the lowest. In other words, it was confirmed that the light absorbance of the coated organic-inorganic porous body according to Experimental Example 2-1-5 is the highest.

FIGS. 12 and 13 are views showing a transmission electronic microscopy (TEM) image and an elemental distribution of a coated organic-inorganic porous body according to an embodiment of the present invention.

Referring to FIG. 12, an element distribution for titanium, zirconium, and zinc of the coated organic-inorganic porous body according to Experimental Example 2-1-5 of the present invention was confirmed.

As described above with reference to FIGS. 4 and 5, the zirconium may be included in the metal oxide cluster, and the zinc may be included in the linker. Accordingly, it can be understood that the zirconium and the zinc are uniformly distributed inside the ceramic shell of the coated organic-inorganic porous body.

In contrast, titanium may be included in the ceramic shell, and thus it can be understood that the titanium is distributed mainly on the surface of the coated organic-inorganic porous body.

Referring to FIG. 13, an enlarged view of the coated organic-inorganic porous body described above with reference to FIG. 12 is shown.

As can be understood from FIG. 13, it can be seen that the ceramic layer is relatively uniformly coated on the surface of the organic-inorganic porous body when the number of repeating the coating process is 50. In other words, it was confirmed that the ceramic layer is coated with a comparatively uniform thickness on the entire surface of the organic-inorganic porous body.

FIG. 14 is a view showing a transmittance of a coated organic-inorganic porous body and a composite catalyst for carbon dioxide reduction according to an embodiment of the present invention.

Referring to FIG. 14, the transmittance of the coated organic-inorganic porous body according to Experimental Example 2-1-5 of the present invention and the composite catalyst according to Experimental Example 2-2-5 was confirmed.

As described above with reference to FIGS. 4 and 5, the composite catalyst was prepared by coating the molecular reduction catalyst on the coated organic-inorganic porous body.

Accordingly, as shown in FIG. 14, it was confirmed that the composite catalyst and the coated organic-inorganic porous body exhibit substantially similar transmittances.

In contrast, as described above, the composite catalyst may further include the molecular reduction catalyst compared to the coated organic-inorganic porous body, and thus the transmittance of the molecular reduction catalyst is observed in the range of 1800/cm to 2100/cm.

FIG. 15 is a view showing a nitrogen adsorbed curve of a coated organic-inorganic porous body and a composite catalyst for carbon dioxide reduction according to an embodiment of the present invention.

Referring to FIG. 15, the surface area of the coated organic-inorganic porous body according to Comparative Example 1 and Experimental Example 2-1-5 of the present invention and the composite catalyst for carbon dioxide reduction according to Experimental Example 2-2-5 is as shown in <Table 5> below.

TABLE 5

|  | Surface area ($m^2/g$) |
| --- | --- |
| Comparative Example 1 | 882 |
| Experimental Example 2-1-5 | 683 |
| Experimental Example 2-2-5 | 582 |

As can be understood from <Table 5> and FIG. 15, it can be seen that the organic-inorganic porous body (Comparative Example 1) further includes the ceramic shell (Experimental Example 2-1-5) and the surface area decreases.

In addition, it was confirmed that the coated organic-inorganic porous body (Experimental Example 2-1-5) further includes the molecular reduction catalyst (Experimental Example 2-2-5) and the surface area decreases.

FIG. 16 is a view showing a pore distribution of a coated organic-inorganic porous body and a composite catalyst for carbon dioxide reduction according to an embodiment of the present invention.

Referring to FIG. 16, the distribution of pores in the coated organic-inorganic porous body according to Comparative Example 1 and Experimental Example 2-1-5 of the present invention and the composite catalyst for carbon dioxide reduction according to Experimental Example 2-2-5 was confirmed.

As shown in FIG. 15, it can be understood that the coated organic-inorganic porous body according to Comparative Example 1 and Experimental Example 2-1-5 and the composite catalyst for carbon dioxide reduction according to Experimental Example 2-2-5 have pores substantially similar in size.

However, it can be understood that the ceramic shell is coated on the surface of the organic-inorganic porous body (Comparative Example 1) (Experimental Example 2-1-5) and the density of the pores decreases.

It was confirmed for the composite catalyst (Experimental Example 2-2-5) that the molecular reduction catalyst may be substantially bonded to a part of the coated organic-inorganic porous body (Experimental Example 2-1-5) and thus the composite catalyst (Experimental Example 2-2-5) and the coated organic-inorganic porous body (Experimental Example 2-1-5) have substantially similar distributions of the pores.

Hereinafter, the method for preparing a catalytic composition for carbon dioxide reduction according to a specific experimental example of the present invention and the results of evaluating properties will be described.

Preparing of Catalytic Composition for Carbon Dioxide Reduction According to Comparative Example 3

A catalytic composition for carbon dioxide reduction according to Comparative Example 3 was prepared by adding 1,3-dimethyl-2-phenyl-1,3-dihydrobenzimidazole (BIH), which is a sacrificial electron donor, into 3 ml of dimethylformamide (DMF) solution saturated with carbon dioxide and then providing 0.1 mM of (bpy)$Re^I(CO)_3Cl$ (where bpy is 2,2-bipyridine) represented by <Formula 36> below and 0.1 mM of tetrakis(4-carboxyphenyl)porphyrin) (TCPP) represented by <Formula 37> below.

<Formula 36>

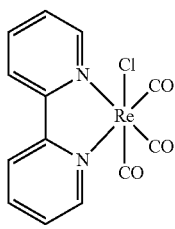

<Formula 37>

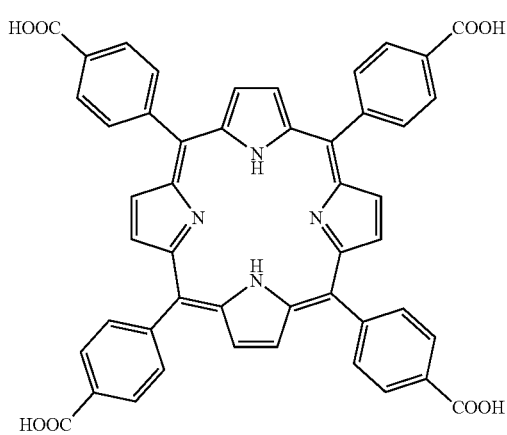

Preparing of Catalytic Composition for Carbon Dioxide Reduction According to Experimental Example 3

A composite catalyst in which 0.21 umol of $(L)Re^I(CO)_3Cl$ is bonded per 3 mg of PCN-222(Zn) was prepared by the same method as described above in Experimental Example 1-1, except for providing PCN-222(Zn) into an ethanol solution containing $(L)Re^I(CO)_3Cl$.

A catalytic composition for carbon dioxide reduction according to Experimental Example 3 was prepared by adding 1,3-dimethyl-2-phenyl-1,3-dihydrobenzimidazole (BIH), which is a sacrificial electron donor, into 3 ml of dimethylformamide (DMF) solution saturated with carbon dioxide and then providing 3 mg of the composite catalyst according to the first embodiment.

Preparing of Catalytic Composition for Carbon Dioxide Reduction According to Experimental Example 3-1

A catalytic composition for carbon dioxide reduction according to Experimental Example 3-1 was prepared by the same method as described above in Experimental Example 3, except for further providing 3 vol % of distilled water ($H_2O$) as an additive into 3 ml of dimethylformamide (DMF) solution saturated with carbon dioxide.

Preparing of Catalytic Composition for Carbon Dioxide Reduction According to Experimental Example 3-2

A catalytic composition for carbon dioxide reduction according to Experimental Example 3-2 was prepared by the same method as described above in Experimental Example 3, except for further providing 3 vol % of 2,2,2-trifluoroethanol (TFE) as an additive into 3 ml of dimethylformamide (DMF) solution saturated with carbon dioxide.

Constituent materials of the catalytic composition for carbon dioxide reduction according to Comparative Example 3 and Experimental Examples 3 to 3-2 as described above are shown in <Table 6> below.

TABLE 6

| | Organic-inorganic porous body | | Molecular reduction | |
|---|---|---|---|---|
| | Metal oxide cluster | Linker | catalyst | Additive |
| Comparative Example 3 | — | TCPP | $(bpy)Re^I(CO)_3Cl$ | — |
| Experimental Example 3 | $Zr_6O8$ | ZnP | $(L)Re^I(CO)_3Cl$ | — |
| Experimental Example 3-1 | $Zr_6O8$ | ZnP | $(L)Re^I(CO)_3Cl$ | $H_2O$ |
| Experimental Example 3-2 | $Zr_6O8$ | ZnP | $(L)Re^I(CO)_3Cl$ | TFE |

Preparing of Catalytic Composition for Carbon Dioxide Reduction According to Experimental Example 4-1-1

A catalytic composition for carbon dioxide reduction according to Experimental Example 4-1-1 was prepared by the same method as described above in the catalytic composition for carbon dioxide reduction according to Experimental Example 3-1, except for providing the composite catalyst for carbon dioxide reduction according to Experimental Example 2-2-1 instead of the composite catalyst for carbon dioxide reduction according to Experimental Example 1-3.

Preparing of Catalytic Composition for Carbon Dioxide Reduction According to Experimental Example 4-1-2

A catalytic composition for carbon dioxide reduction according to Experimental Example 4-1-2 was prepared by the same method as described above in the catalytic composition for carbon dioxide reduction according to Experimental Example 3-1, except for providing the composite catalyst for carbon dioxide reduction according to Experimental Example 2-2-2 instead of the composite catalyst for carbon dioxide reduction according to Experimental Example 1-3.

Preparing of Catalytic Composition for Carbon Dioxide Reduction According to Experimental Example 4-1-3

A catalytic composition for carbon dioxide reduction according to Experimental Example 4-1-3 was prepared by the same method as described above in the catalytic composition for carbon dioxide reduction according to Experimental Example 3-1, except for providing the composite catalyst for carbon dioxide reduction according to Experimental Example 2-2-3 instead of the composite catalyst for carbon dioxide reduction according to Experimental Example 1-3.

Preparing of Catalytic Composition for Carbon Dioxide Reduction According to Experimental Example 4-1-4

A catalytic composition for carbon dioxide reduction according to Experimental Example 4-1-4 was prepared by the same method as described above in the catalytic composition for carbon dioxide reduction according to Experimental Example 3-1, except for providing the composite catalyst for carbon dioxide reduction according to Experimental Example 2-2-4 instead of the composite catalyst for carbon dioxide reduction according to Experimental Example 1-3.

Preparing of Catalytic Composition for Carbon Dioxide Reduction According to Experimental Example 4-1-5

A catalytic composition for carbon dioxide reduction according to Experimental Example 4-1-5 was prepared by the same method as described above in the catalytic composition for carbon dioxide reduction according to Experimental Example 3-1, except for providing the composite catalyst for carbon dioxide reduction according to Experimental Example 2-2-5 instead of the composite catalyst for carbon dioxide reduction according to Experimental Example 1-3.

Preparing of Catalytic Composition for Carbon Dioxide Reduction According to Experimental Example 3-2

A catalytic composition for carbon dioxide reduction according to Experimental Example 3-2 was prepared by the same method as described above in the catalytic composition for carbon dioxide reduction according to Experimental Example 3-1, except for providing 2,2,2-trifluoroethanol (TFE) instead of water.

Preparing of Catalytic Composition for Carbon Dioxide Reduction According to Experimental Example 4-2-3

A catalytic composition for carbon dioxide reduction according to Experimental Example 4-2-3 was prepared by the same method as described above in the catalytic composition for carbon dioxide reduction according to Experimental Example 4-1-3, except for providing 2,2,2-trifluoroethanol (TFE) instead of water.

FIGS. 17 and 18 are views showing an amount of carbon monoxide produced with time from a catalytic composition for carbon dioxide reduction according to an embodiment of the present invention.

Referring to FIGS. 17 and 18, the amount of carbon monoxide produced according to the application time of an LED lamp to the catalytic composition for carbon dioxide reduction according to Experimental Examples 3 to 3-1, and Comparative Example 3, and the apparent quantum yield (AQY) are as shown in <Table 7> below.

TABLE 7

| | LED lamp (>500 nm) | $t_{irr}$(h) | CO production amount | | $AQY_{co}$ (X10$^{-2}$) |
|---|---|---|---|---|---|
| | | | TON | umol | |
| Comparative Example 3 | On | 20 | 3.0 ± 0.2 | 0.9 ± <0.1 | — |
| Experimental Example 3 | On | 62 | 200 ± 50 | 20 ± 5 | — |
| Experimental Example 3-2 | On | 137 | 1320 ± 170 | 132 ± 17 | 0.52 ± 0.02 |

TABLE 7-continued

| | LED lamp (>500 nm) | $t_{irr}$(h) | CO production amount | | $AQY_{co}$ (X10$^{-2}$) |
|---|---|---|---|---|---|
| | | | TON | umol | |
| Experimental Example 3-1 | On | 59 | 1130 ± 170 | 113 ± 14 | 1.97 ± 0.07 |
| Experimental Example 3-1 | Off(dark) | 10 | — | — | — |

As can be understood from FIG. 17 and <Table 7>, it can be seen that the catalytic composition for carbon dioxide reduction according to Comparative Example 3 has a substantially constant number of moles (TON) of carbon monoxide produced relative to 1 mole of the molecular reduction catalyst after three hours of irradiation with the LED lamp. In contrast, it can be understood that the catalytic composition for carbon dioxide reduction according to Experimental Example 3 has an increasing number of moles (TON) of carbon monoxide produced even after 60 hours of irradiation with the LED lamp. Accordingly, as described above with reference to FIGS. 1 and 2, it can be understood that it is easier to reduce the carbon dioxide in case of a structure in which an exciton is produced by light energy irradiated from the LED lamp and the linkers for moving the produced exciton are connected to each other by the metal oxide cluster. In other words, it was confirmed that the linkers are arranged at regular intervals and an exciton between the linkers is relatively quickly transferred, so as to more easily perform the reduction of carbon dioxide.

Referring to FIG. 18 and <Table 7>, Bronsted acid 2,2,2-trifluoroethanol (TFE) or water was added to the catalytic composition for carbon dioxide reduction according to Experimental Example 3, respectively, so as to prepare a catalytic composition for carbon dioxide reduction according to Experimental Example 3-2 and Experimental Example 3-1.

As can be understood from FIG. 18 and <Table 7>, it was confirmed that the catalytic composition for carbon dioxide reduction further includes the Bronsted acid and the amount of produced carbon monoxide is further increased. Specifically, it was confirmed for the catalytic composition for carbon dioxide reduction according to Experimental Example 3-2 that 1320±172 moles of the carbon monoxide are produced per 1 mole of the molecular reduction catalyst in 137 hours after irradiation with the LED lamp. In addition, it can be understood for the catalytic composition for carbon dioxide reduction according to Experimental Example 3-1 that 1130±140 moles of the carbon monoxide are produced per 1 mole of the molecular reduction catalyst in 59 hours after irradiation with the LED lamp. Accordingly, an apparent quantum yield (AQY) of the catalytic composition for carbon dioxide reduction according to Experimental Examples 3-2 and 3-1 was calculated according to <Equation 7> below by using the number of moles of the carbon monoxide produced per hour and the light energy irradiated per hour.

$$AQY = \frac{2\times \text{(Number of moles of CO produced per unit time)}}{\text{(Number of moles of light quantum irradiated per unit time)}} \quad \langle\text{Equation 7}\rangle$$

Accordingly, it was confirmed for the catalytic composition for carbon dioxide reduction that the highest carbon monoxide is produced at 436 nm. In addition, it can be understood that an apparent quantum yield (AQY) of the catalytic composition for carbon dioxide reduction according to Experimental Examples 3-2 and 3-1 at 436 nm is $(0.52\pm0.02)\times10^{-2}$ and $(1.97\pm0.07)\times10^{-2}$, respectively.

In addition, referring to <Table 7>, a case where the LED lamp is applied to the catalytic composition for carbon dioxide reduction according to Experimental Example 3-1 was compared with a case where the LED lamp is not applied to the catalytic composition. In the case of providing the catalytic composition for carbon dioxide reduction in a dark room without applying the LED lamp, it was confirmed that the catalytic composition for carbon dioxide reduction does not perform a process of reducing carbon dioxide.

FIG. 19 is a view showing an amount of carbon monoxide produced depending on a cycle of a catalytic composition for carbon dioxide reduction according to an embodiment of the present invention.

Referring to FIG. 19, a cycle was set based on a case where the LED lamp is applied to the catalytic composition for carbon dioxide reduction according to Experimental Examples 3-2 and 3-1 of the present invention for a certain period of time and a case where the LED lamp is not applied for a certain period of time. After 4 or 5 cycles, the amount of produced carbon monoxide is as shown in <Table 8> below.

TABLE 8

|  | | CO production amount | |
| --- | --- | --- | --- |
|  | $t_{irr}$(h) | TON | umol |
| Experimental Example 3-2 | 191 | 962 | 202 |
| Experimental Example 3-1 | 71 | 725 | 152 |

As can be understood from FIG. 19 and <Table 8>, it was confirmed for the catalytic composition for carbon dioxide reduction according to Experimental Example 3-2 that 2.5 umol of the carbon monoxide is produced in a first cycle, and 23.5 umol of the carbon monoxide is produced in an eighth cycle. In this case, the cycle was gradually increased every 24 hours, and a total of 202 umol of the carbon monoxide was produced for 190 hours. In contrast, it was confirmed for the catalytic composition for carbon dioxide reduction according to Experimental Example 3-1 that a total of 152.3 umol of the carbon monoxide is produced for 45 hours. Accordingly, it was confirmed for the catalytic composition for carbon dioxide reduction according to Experimental Examples 3-2 and 3-1 of the present invention that the carbon dioxide reduction process is stably performed according to cycles and the composition can be reused.

FIG. 20 is a view showing an amount of carbon monoxide produced depending on an addition of a molecular reduction catalyst due to an inactivated catalytic composition for carbon dioxide reduction according to Experimental Example 3-2 of the present invention.

Referring to FIG. 20, it was confirmed that the carbon monoxide is not substantially generated when using the catalytic composition for carbon dioxide reduction according to Experimental Example 3-2 of the present invention for about 140 hours. Accordingly, it was confirmed that the carbon monoxide is easily produced with time after further adding about 0.1 μmol of the molecular reduction catalyst to the catalytic composition for carbon dioxide reduction.

In general, a monomolecular light harvesting organic material may decompose in reaction to various reactive species during light irradiation. In contrast, according to an embodiment of the present invention, it was confirmed that the catalytic composition for carbon dioxide reduction changes from inert to active when the molecular reduction catalyst is further added. Accordingly, it can be understood that the linker, which is a monomolecular light harvesting organic material, is not subjected to photolysis during light irradiation. Thus, as described above with reference to FIGS. 3 and 4, it can be understood that the linker may be bonded to the metal oxide cluster to obtain a structure of the organic-inorganic porous body, and thus the linker may substantially maintain a structure of the linker without the photolysis during catalytic activity.

The number of moles (TON) of carbon monoxide produced per 1 mole of the molecular reduction catalyst according to the visible light exposure time of the catalytic composition for carbon dioxide reduction according to Experimental Examples 3-1 and 4-1-1 to 4-1-5 described above and the total amount of production are as shown in <Table 9> below.

TABLE 9

|  | | CO production amount | |
| --- | --- | --- | --- |
|  | $t_{irr}$ (hr) | TON | umol |
| Experimental Example 3-1 | 42 | 562 | 118 |
| Experimental Example 4-1-1 | 42 | 248 | 52 |
| Experimental Example 4-1-2 | 42 | 214 | 45 |
| Experimental Example 4-1-3 | 42 | 495 | 104 |
| Experimental Example 4-1-5 | 42 | 152 | 32 |

As can be understood from <Table 9>, it can be seen that the amount of produced carbon monoxide is almost substantially constant for the catalytic composition including the composite catalyst prepared by repeating the coating processes more than 0 and less than 20 times.

In contrast, it can be understood that the amount of produced carbon monoxide decreases as the number of the coating processes increases in case of the catalytic composition including the composite catalyst prepared by repeating the coating process at least 20 times that.

In other words, it can be understood that the catalytic composition (Experimental Example 4-1-3) including the composite catalyst prepared by repeating the coating process 20 times has the highest amount of the produced carbon monoxide among the catalytic compositions including the composite catalyst having the ceramic shell.

In addition, it was confirmed for the catalytic composition prepared according to Experimental Example 4-1-3 that the amount of the produced carbon monoxide is substantially similar to that of the composite catalyst according to Experimental Example 3-1 (that is, the catalytic composition including the composite catalyst not having the ceramic shell).

Accordingly, the catalytic composition for carbon dioxide reduction according to Experimental Examples 3-2 and 4-2-3 was prepared by changing the type of the additive in the catalytic composition having a high amount of the produced carbon monoxide.

The carbon dioxide was provided four or five times to the catalytic composition for carbon dioxide reduction according to Experimental Examples 4-1-3 and 4-2-3 and the measured amount of the produced carbon monoxide is as shown in <Table 10> below.

TABLE 10

| | $t_{irr}$ (hr) | CO production amount | |
| --- | --- | --- | --- |
| | | TON | umol |
| Experimental Example 4-1-3 | 71 | 943 | 198 |
| Experimental Example 4-2-3 | 191 | 1,466 | 308 |

As can be understood from <Table 10>, it can be seen that a higher amount of the produced carbon monoxide is displayed when the catalytic composition contains the 2,2,2-trifluoroethanol rather than the water as the additive.

FIG. 21 is a view showing an efficiency of generation of carbon monoxide per catalyst of a catalytic composition for carbon dioxide reduction according to an embodiment of the present invention.

Referring to FIG. 21, as described above with reference to <Table 9> and <Table 10>, the efficiency of generation of carbon monoxide was confirmed with regard to the catalytic composition further including the 2,2,2-trifluoroethanol exhibiting a high amount of the produced carbon monoxide as the additive.

As shown in FIG. 21, the catalytic activity of the catalytic composition was confirmed after the carbon dioxide was blown into a dark room for 30 minutes (marked with *) with the elapse of a certain period of time. In this case, it can be understood that in the initial step of measuring the catalytic activity, the catalytic composition for carbon dioxide reduction according to Experimental Example 3-2 exhibits an efficiency of generation of the carbon monoxide higher than that of the catalytic composition for carbon dioxide reduction according to Experimental Example 4-2-3.

However, it was confirmed that the catalytic composition for carbon dioxide reduction according to Experimental Example 4-2-3 exhibits an efficiency of generation of the carbon monoxide higher than that of the catalytic composition for carbon dioxide reduction according to Experimental Example 3-2 since a second restart after blowing the carbon dioxide.

In addition, in a fifth restart (last marked with *), the molecular reduction catalyst was further added to the catalytic composition to confirm the efficiency of generation of the carbon monoxide from the catalytic composition. In this case, as shown in FIG. 21, it can be understood that the efficiency of generation of the carbon monoxide from the catalytic composition increases with the time.

In general, a monomolecular light harvesting organic material may decompose in reaction to various reactive species during light irradiation. In contrast, according to an embodiment of the present invention, it was confirmed that the catalytic activity of the catalytic composition for carbon dioxide reduction increases when the molecular reduction catalyst is further added. Accordingly, it can be understood that the linker, which is a monomolecular light harvesting organic material, is not subjected to photolysis during light irradiation.

FIG. 22 is a view showing a generation amount of carbon monoxide added up compared to a total reaction time of a catalytic composition for carbon dioxide reduction according to an embodiment of the present invention.

Referring to FIG. 22, the number of moles (TON) of carbon monoxide produced per 1 mole of the catalytic composition for carbon dioxide reduction according to Experimental Examples 3-2 and 4-2-3 described above with reference to FIG. 21 was added up.

Accordingly, as described above with reference to FIG. 21, it can be understood that the catalytic composition further including the ceramic shell (Experimental Example 4-2-3) exhibits the amount of the produced carbon monoxide lower than that of the catalytic composition not including the ceramic shell at the initial stage of the catalytic activity (Experimental Example 3-2).

In contrast, it was confirmed that the amount of carbon monoxide produced by the catalytic composition including the ceramic shell (Experimental Example 4-2-3) is higher than the amount of carbon monoxide produced by the catalytic composition not including the ceramic shell (Experimental Example 3-2), as the catalytic activity time increases.

Although the invention has been described in detail with reference to exemplary embodiments, the scope of the present invention is not limited to a specific embodiment and should be interpreted by the attached claims. In addition, those skilled in the art should understand that many modifications and variations are possible without departing from the scope of the present invention.

According to an embodiment of the present invention, a composite catalyst for carbon dioxide reduction may include an organic-inorganic porous body having a linker, and a molecular reduction catalyst bonded with the organic-inorganic porous body and receiving an electron from the linker to exhibit a catalytic activity, and thus may be used as a catalyst for providing the electron to carbon dioxide so as to reduce carbon dioxide into carbon monoxide.

What is claimed is:

1. A method for preparing a composite catalyst for carbon dioxide reduction, the method comprising:
    providing an organic-inorganic porous body;
    dispersing the organic-inorganic porous body in a solution containing a molecular reduction catalyst having a rhenium (Re) complex to prepare a composite catalyst in which the organic-inorganic porous body and the molecular reduction catalyst are bonded,
    wherein the organic-inorganic porous body includes a metal oxide cluster containing zirconium oxide ($Zr_6O_8$) and a light harvesting organic material with zinc-porphyrin (ZnP) as a linker between the metal oxide clusters, and the linker absorbs visible light to form an exciton, and moves the exciton through energy transfer between the linkers to transfer an electron of the exciton to the molecular reduction catalyst, and
    coating a surface of the organic-inorganic porous body with a ceramic shell containing titanium oxide ($TiO_2$) after providing the organic-inorganic porous body, wherein the electron of the exciton formed by the linker is transferred to the molecular reduction catalyst through the metal oxide cluster coated with the ceramic shell.

2. The method of claim 1, wherein the molecular reduction catalyst is mixed in a range of 0.01% or more compared to the organic-inorganic porous body.

3. The method of claim 1, wherein the coating with the ceramic shell is performed by an atomic layer deposition method.

4. The method of claim 1, wherein the coating with the ceramic shell comprises: charging the organic-inorganic porous body into a chamber; providing a metal precursor into the chamber; and providing an oxygen precursor into the chamber to react the metal precursor bonded with the surface of the organic-inorganic porous body with the oxygen precursor, wherein the providing of the metal precursor and the providing of the oxygen precursor are defined as one unit process, and the unit process is repeatedly performed.

5. The method of claim 4, wherein the unit process is performed in a range of 15 to 25 times.

6. The method of claim 4, wherein the metal precursor is titanium isopropoxide (TTIP).

7. The method of claim 4, wherein the oxygen precursor is water.

* * * * *